(12) United States Patent
Lee

(10) Patent No.: US 7,060,625 B2
(45) Date of Patent: Jun. 13, 2006

(54) IMPRINT STAMP

(75) Inventor: Heon Lee, Seoul (KR)

(73) Assignee: Hewlett-Packard Development Company, L.P., Houston, TX (US)

( * ) Notice: Subject to any disclaimer, the term of this patent is extended or adjusted under 35 U.S.C. 154(b) by 361 days.

(21) Appl. No.: 10/766,710

(22) Filed: Jan. 27, 2004

(65) Prior Publication Data

US 2006/0021967 A1    Feb. 2, 2006

(51) Int. Cl.
    H01L 21/311    (2006.01)
(52) U.S. Cl. .................. 438/702; 216/72; 430/323
(58) Field of Classification Search ................ 438/700, 438/702, 703, 706, 714; 216/8, 72; 430/320, 430/323
    See application file for complete search history.

(56) References Cited

U.S. PATENT DOCUMENTS

| 6,294,450 | B1 | 9/2001 | Chen et al |
| 6,334,960 | B1 | 1/2002 | Willson et al |
| 6,407,443 | B1 | 6/2002 | Chen et al |
| 6,413,790 | B1 | 7/2002 | Duthaler et al |
| 6,482,742 | B1 | 11/2002 | Chou |
| 6,521,489 | B1 | 2/2003 | Duthaler et al |
| 6,671,034 | B1 * | 12/2003 | Hatakeyama et al. ......... 355/67 |
| 6,673,714 | B1 | 1/2004 | Lee et al |
| 6,755,984 | B1 * | 6/2004 | Lee et al. ..................... 216/54 |
| 2003/0141276 | A1 * | 7/2003 | Lee ............................... 216/8 |
| 2003/0205657 | A1 * | 11/2003 | Voisin ..................... 249/187.1 |
| 2004/0211754 | A1 * | 10/2004 | Sreenivasan .................. 216/41 |
| 2004/0266064 | A1 * | 12/2004 | Davison ..................... 438/120 |
| 2005/0161431 | A1 * | 7/2005 | Lee .............................. 216/54 |

\* cited by examiner

Primary Examiner—Kin-Chan Chen

(57) ABSTRACT

A method of fabricating an imprint stamp is disclosed. The imprint stamp includes a plurality of layers of material that are deposited in a deposition order. After deposition, each layer is patterned and then etched to form a portion of an application specific imprint pattern. The portion includes variations in a topography of the layer. The application specific imprint pattern comprises a plurality of features that are defined by the variations in the topographies of all of the layers of material that were deposited, patterned, and etched. The imprint stamp can be used in a soft-lithography process by pressing the application specific imprint pattern into a mask layer in which the application specific imprint pattern is replicated.

32 Claims, 24 Drawing Sheets

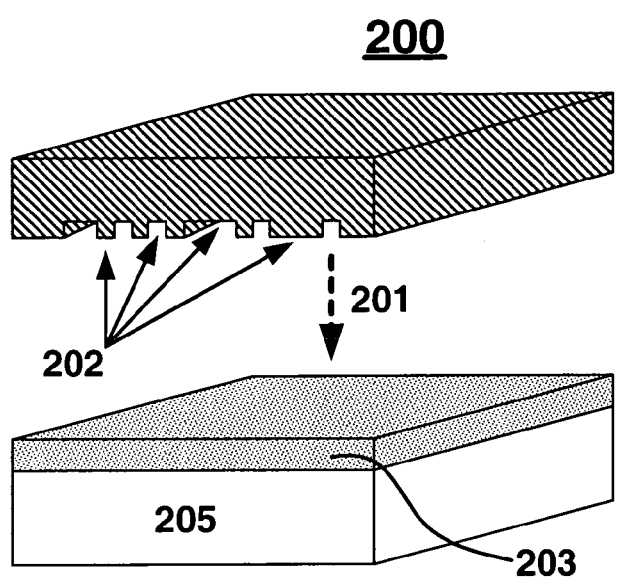
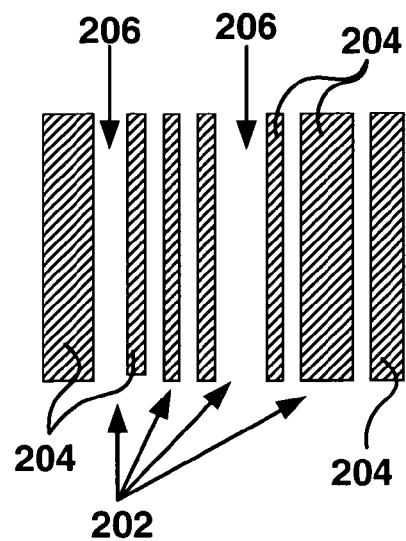
FIG. 1a (Prior Art)
FIG. 1b (Prior Art)
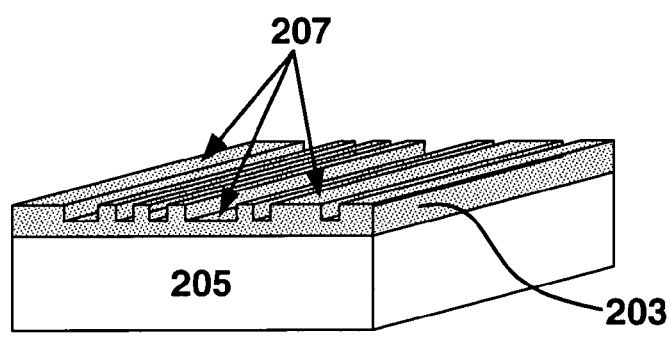
FIG. 2 (Prior Art)
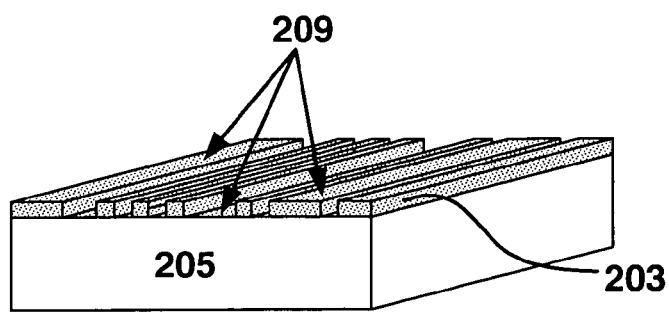
FIG. 3 (Prior Art)

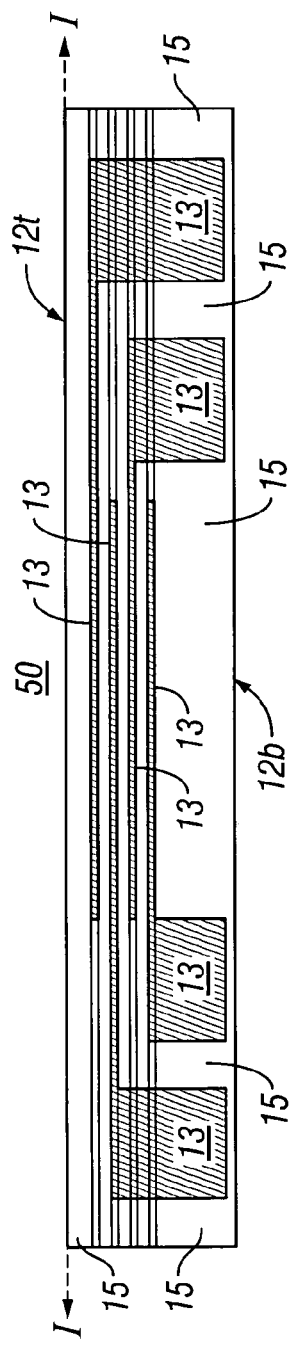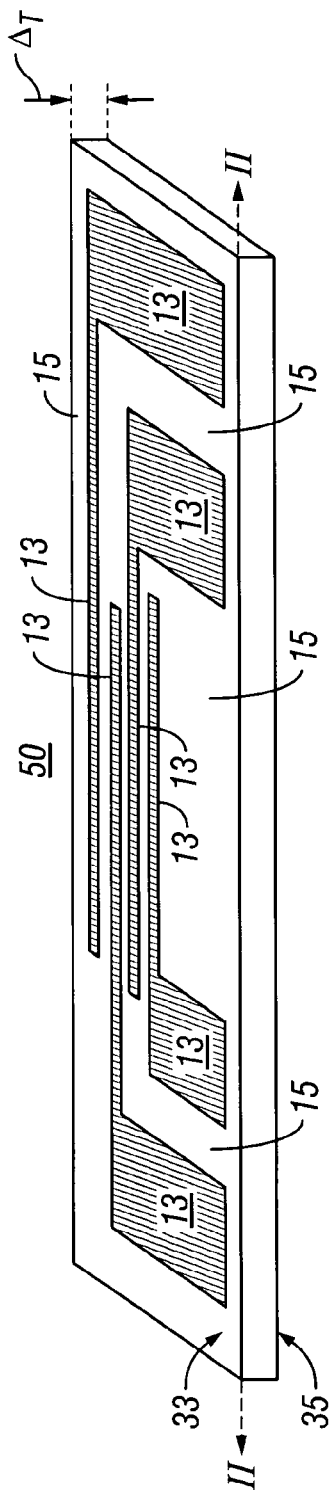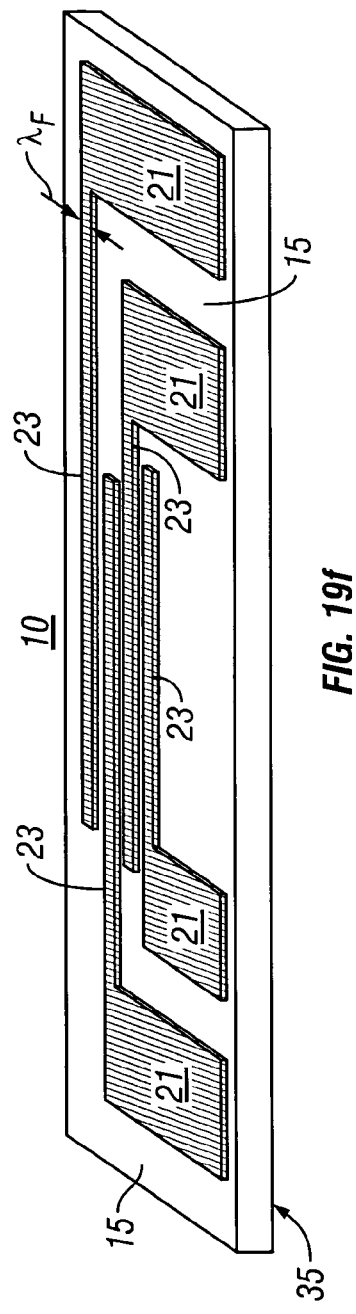
FIG. 19d
FIG. 19e
FIG. 19f

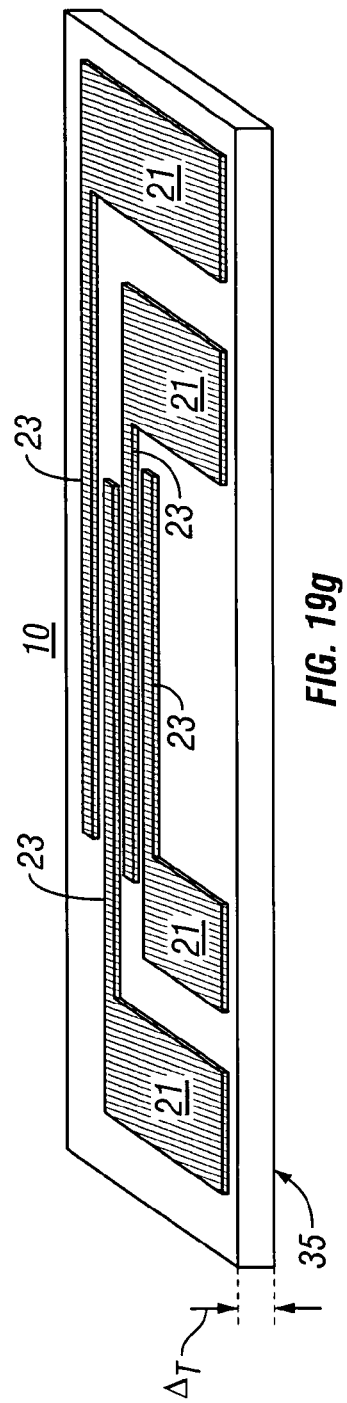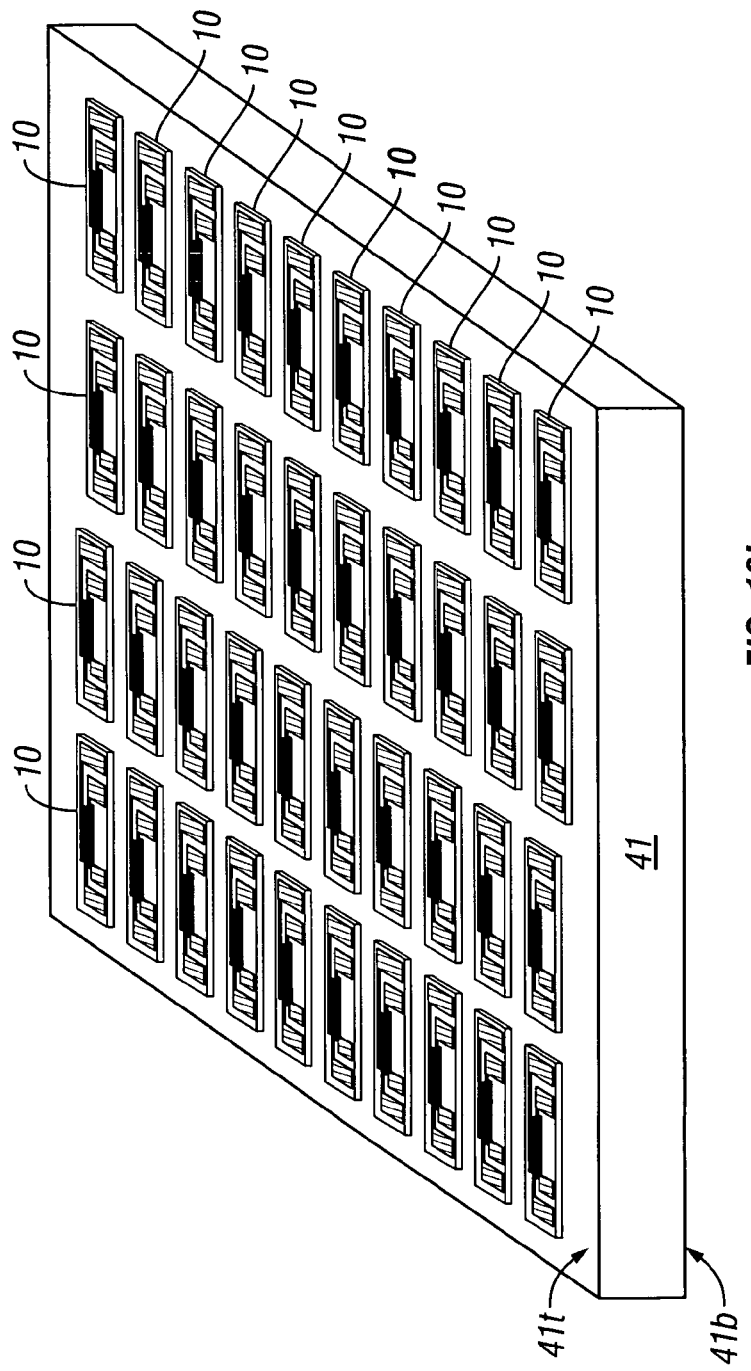

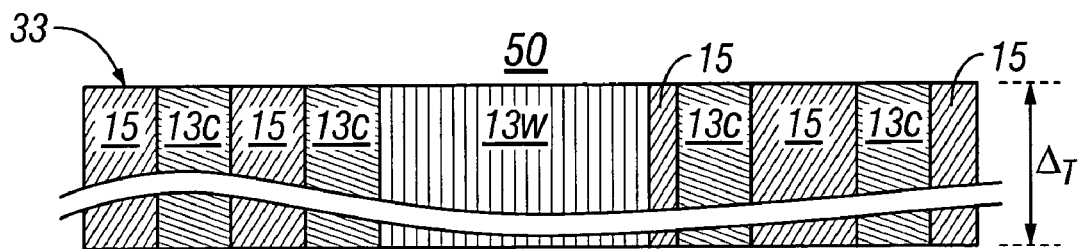
FIG. 21
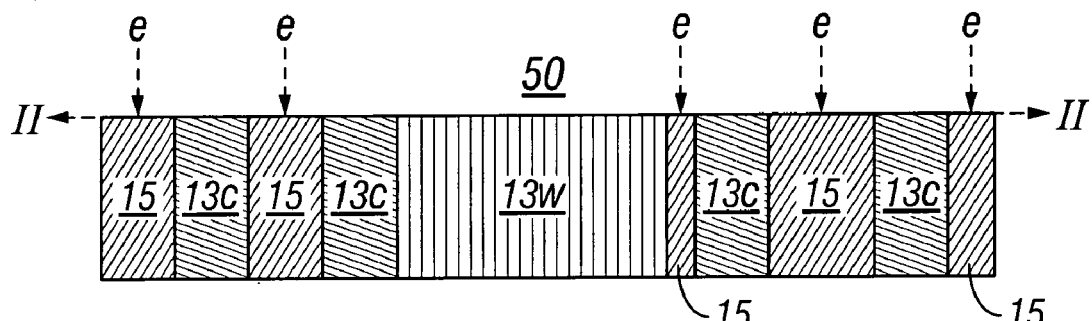
FIG. 22a
FIG. 22b
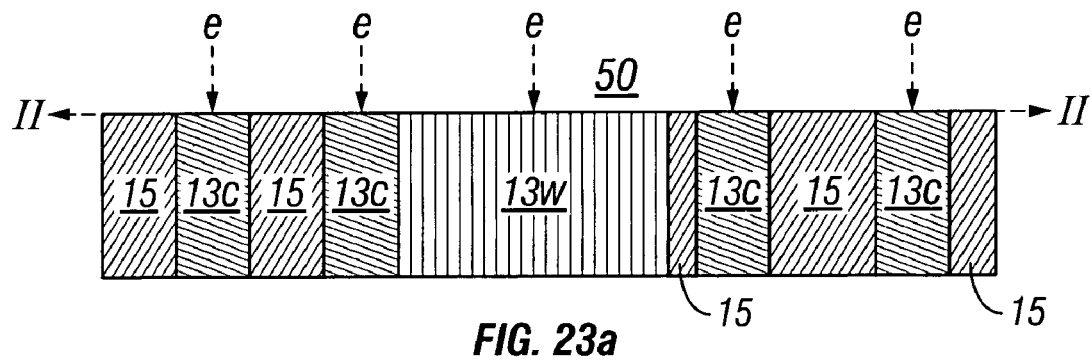
FIG. 23a
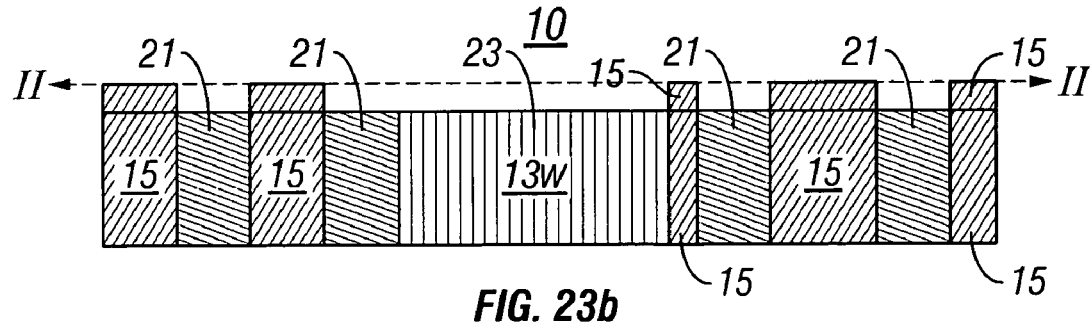
FIG. 23b

US 7,060,625 B2

IMPRINT STAMP

FIELD OF THE INVENTION

The present invention relates generally to a method of fabricating an imprint stamp. More specifically, the present invention relates to a method of fabricating an imprint stamp using controlled thin film deposition processes, lithographic patterning processes, and etching processes to form an the imprint stamp that includes an application specific imprint pattern.

BACKGROUND OF THE ART

Imprint lithography (also referred to as soft lithography) is a promising technique for transferring images from an imprint stamp to a media in which the images are replicated. Unlike current state-of-the-art photolithographic processes which require very expensive process equipment to make masks and to expose a photoresist material with an image on the mask, imprint lithography is a low cost process that eliminates the expensive mask making equipment and lithographic equipment, not to mention the equipment and materials needed to develop and etch the photoresist material. Nano-imprint lithography is a promising technique for obtaining nano-size patterns (as small as a few tens of nanometers or less) in a media. A key step in forming the nano-size patterns in the media is to first form an imprint stamp that includes a pattern that complements the nano-sized patterns that are to be imprinted in the media. Although an imprint stamp can be made to imprint features of any size, imprint stamps with features that are nanometer sized or smaller are of particular interest because of a need to imprint features that are smaller than a lithography limit of current optical base photolithography processes and at a lower cost.

In FIG. 1a, a prior nano-imprint lithography process includes an imprint stamp 200 having a plurality of imprint patterns 202 formed thereon. In FIG. 1b, the imprint patterns 202 consists of a simple line and space pattern having a plurality of lines 204 separate by a plurality of spaces 206 between adjacent lines 204. In FIG. 1a, by pressing (see dashed arrow 201) the imprint stamp 200 onto a mask layer 203, a thickness of the mask layer 203 is modulated with respect to the imprint patterns 202 such that the imprint patterns 202 are replicated in the mask layer 203. Typically, the mask layer 203 is made from a material such as a polymer. For example, a photoresist material can be used for the mask layer 203. The mask layer 203 is deposited on a supporting substrate 205. Using a step and repeat process, the imprint stamp 200 is repeatedly pressed 201 into the mask layer 203 to replicate the imprint patterns 202 in the mask layer 203 and to cover a desired area of the mask layer 203.

In FIG. 2, after the step and repeat process, the mask layer 203 includes a plurality of nano-size impressions 207 that complement the shape of the imprint patterns 202. In FIG. 3, the mask layer 203 is anisotropically etched (i.e. a highly directional etch) to form nano-sized patterns 209 in the mask layer 203. Typically, the supporting substrate 205 or another layer (not shown) positioned between the mask layer 203 and the supporting substrate 205 serves as an etch stop for the anisotropic etch. Alternatively, the mask layer 203 can serve as an etch mask for an underlying layer (see reference numeral 208 in FIGS. 7a through 7d) and the pattern of the nano-size impressions 207 is replicated in the underlayer 208 by a subsequent anisotropic etch process.

In FIG. 4a, the formation of the imprint patterns 202 on the prior imprint stamp 200 begins by depositing alternating layers of thin film material (211, 213) on a substrate 215 to form a multi-stacked thin film 210 that extends outward of a surface 215s of the substrate 215. In FIG. 4b, the thin film layers (211, 213) have thicknesses $t_A$ and $t_B$ respectively that can be the same or that can vary. For example, the layer 211 can have a thickness $t_A$ that is thicker at one level of the multi-stacked thin film 210 and thinner at another level of the multi-stacked thin film 210 as depicted in FIG. 4b. Similarly, the layer 213 also has thicknesses $t_B$ that vary in thickness in the multi-stacked thin film 210. Those variations in thickness ($t_A$, $t_B$) will result in variations in the simple line and space patterns (204, 206) in the imprint pattern 202 of the imprint stamp 200 as will be described below in reference to FIGS. 5a through 5c.

In FIG. 4a, the multi-stacked thin film 210 is then sliced into a plurality of discrete segments $\Delta_s$ along a direction shown by dashed arrow S. For example, in FIG. 4c, the substrate 215 can be a wafer of semiconductor material upon which the multi-stacked thin film 210 is deposited. After all layers of the multi-stacked thin film 210 have been deposited, the wafer (i.e. the substrate 215) is then sliced, using a saw or the like, to form the discrete segments $\Delta_s$.

In FIG. 5a, a discrete segment $\Delta_s$ includes a portion of the multi-stacked thin film 210 and a portion of the substrate 215. In FIGS. 5b and 5c, the discrete segment $\Delta_s$ is selectively etched to define the imprint pattern 202. Differences in etch rates between the alternating layers (211, 213) causes one of the layers to be etched at a faster rate than the other layer and results in differences in height between the alternating layers (211, 213). Those differences in height define the imprint pattern 202. Additionally, the differences in the thicknesses ($t_A$, $t_B$) determines the variations in the widths of the lines 204 and the widths of the spaces 206 of the imprint pattern 202. The imprint pattern 202 is formed on a portion $I_A$ of the imprint stamp 200 as illustrated in FIGS. 5b, 5c, and 6. A remaining portion $N_A$ of the imprint stamp 200 is a non-patternable area, that is, the portion $N_A$ cannot be used for imprinting because that portion of the substrate 215 does not include an imprint pattern.

One disadvantage of the prior imprint stamp 200 is the imprint pattern 202 consists of simple line and space patterns (204, 206) as depicted in FIGS. 6, 7a, 7b, 7c, and 7d, wherein, the line and space patterns (204, 206) are substantially parallel to each other as denoted by dashed lines P in FIG. 7a. Consequently, in FIGS. 7b, 7c, and 7d, the resulting nano-size impressions 207 are also limited to simple line 204' and space 206' patterns because they complement the line and space patterns (204, 206) of the imprint pattern 202 and are therefore also substantially parallel to each other as denoted by dashed lines P in FIGS. 7b and 7c.

In FIG. 7a, the imprint stamp 200 is pressed 201 onto the mask layer 203 to replicate the simple line 204 and space 206 patterns of the imprint pattern 202 in the mask layer 203. In FIG. 7b, after the pressing step, the mask layer 203 includes the complementary nano-size impressions 207 replicated therein. As was noted above, the nano-size impressions 207 also have the simple line and space pattern denoted as 204' and 206' respectively. In FIG. 7c, the mask layer 203 is anisotropically etched until the space patterns 206' are coincident with an upper surface 208' of an underlayer 208 and the line patterns 204' extend outward of the upper surface 208'. The line and space patterns (204', 206') will serve as an etch mask for a subsequent anisotropic etch step. Next, in FIG. 7d, the underlayer 208 is anisotropically etched through the mask created by the line and space patterns (204', 206') to define the nano-size patterns 209 that complement the simple line and space patterns (204, 206) of the imprint stamp 200. The nano-size patterns 209 occupy a patterned area $P_A$ of the substrate 205; whereas, a remainder of the substrate 205 comprises an unpatterned area $U_A$.

Consequently, there exists a need for an imprint stamp that includes an application specific imprint pattern comprising complex patterns and shapes. There is also a need for an imprint stamp that includes an application specific imprint pattern that includes feature sizes that are smaller than a minimum resolution of a lithography system used in fabricating the imprint stamp. Furthermore, there is a need for an imprint stamp that includes an application specific imprint pattern that includes feature sizes that are of nanometer dimensions or less.

SUMMARY OF THE INVENTION

The imprint stamp of the present invention solves the aforementioned disadvantages and limitations. The imprint stamp includes complex patterns and shapes that are defined by a plurality of thin film layers. The imprint stamp can include complex patterns and shapes that have feature sizes that are of nanometer dimension or less, because the thin film layers that are used to form the features can have thickness that are a few nanometers or less. The thin film layers include variations in a topography so that each layer can include one or more segments that are non-planar. Those variations in topography taken individually or in combination with the variations in topography of some or all of the other thin film layers define an application specific imprint pattern that includes complex patterns and valuable shapes unlike prior imprint stamps in which the pattern consisted of simple line and space patterns formed by substantially planar layers of material.

An imprint stamp fabricated according to the method described herein provides for a higher imprint pattern density (i.e a ratio of the area occupied by the pattern to a total area of the imprint stamp) and provides for complex imprint patterns as opposed to the simple line and space patterns of prior imprint stamps.

Other aspects and advantages of the present invention will become apparent from the following detailed description, taken in conjunction with the accompanying drawings, illustrating by way of example the principles of the present invention.

BRIEF DESCRIPTION OF THE DRAWINGS

FIGS. 1a and 1b are profile and top plan views respectively of a prior imprint stamp that includes simple line and space imprint patterns.

FIG. 2 is a profile view of a prior mask layer with simple line and space impression formed therein by the prior imprint stamp of FIG. 1a.

FIG. 3 is a profile view of the prior mask layer of FIG. 2 after an anisotropic etch step.

FIG. 19d is a top plan view depicting an imprint blank.

FIG. 19e is profile view depicting an imprint blank.

FIGS. 19f and 19g are profile views of an imprint stamp.

FIG. 19h is profile view depicting a plurality of imprint stamps connected with a master substrate.

FIG. 21 is a cross-sectional view along line IV—IV of FIG. 20c and depicts an imprint blank before a selective etching process.

FIG. 22a is a cross-sectional view depicting a selective etching of a layer of material in an imprint blank.

FIG. 22b is a cross-sectional view depicting an imprint stamp formed by the etching process of FIG. 22a.

FIG. 23a is a cross-sectional view depicting a selective etching of a layer of material in an imprint blank.

FIG. 23b is a cross-sectional view depicting an imprint stamp formed by the etching process of FIG. 23a.

FIG. 30b is a cross-sectional view depicting a depositing of a conformal layer of material on the patterned substrate of FIG. 30a.

DETAILED DESCRIPTION

Figure 4A:
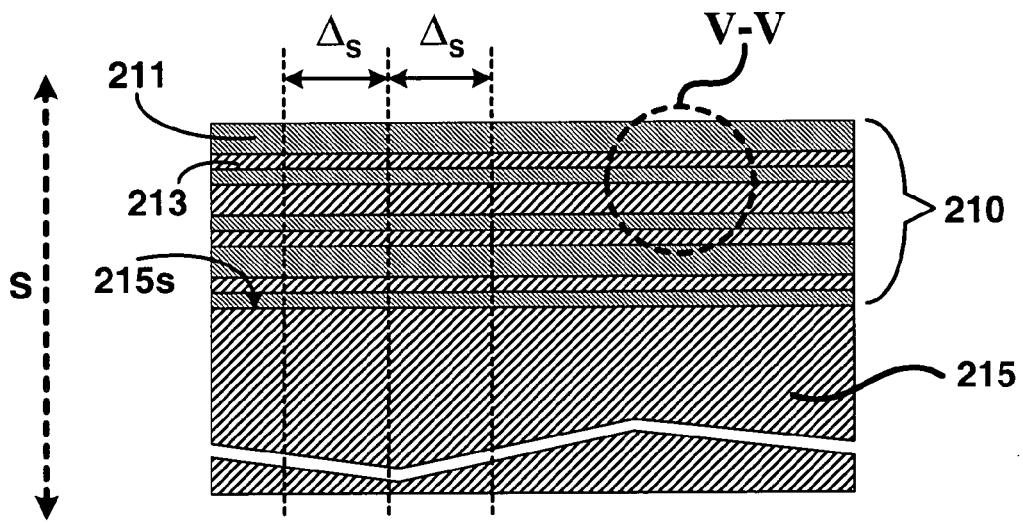
FIG. 4a is a cross-sectional view of a prior process for forming a prior imprint stamp.
Figure 4B:
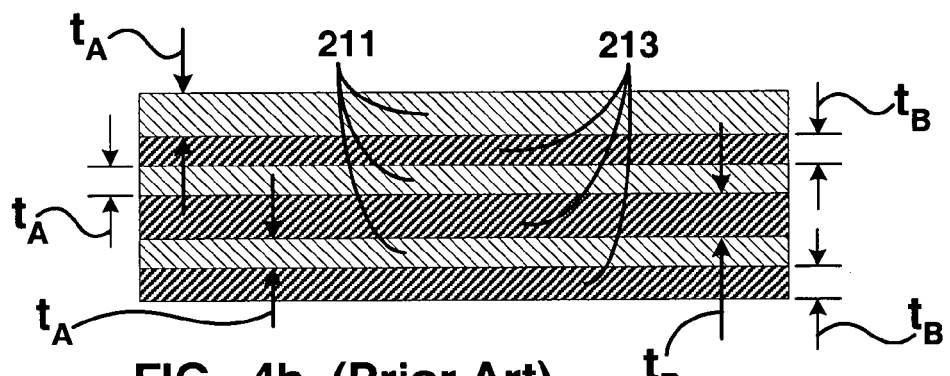
FIG. 4b is a detailed cross-sectional view of a section V—V of FIG. 4a and depicts layers of the prior imprint stamp that are of differing thicknesses.
Figure 4C:
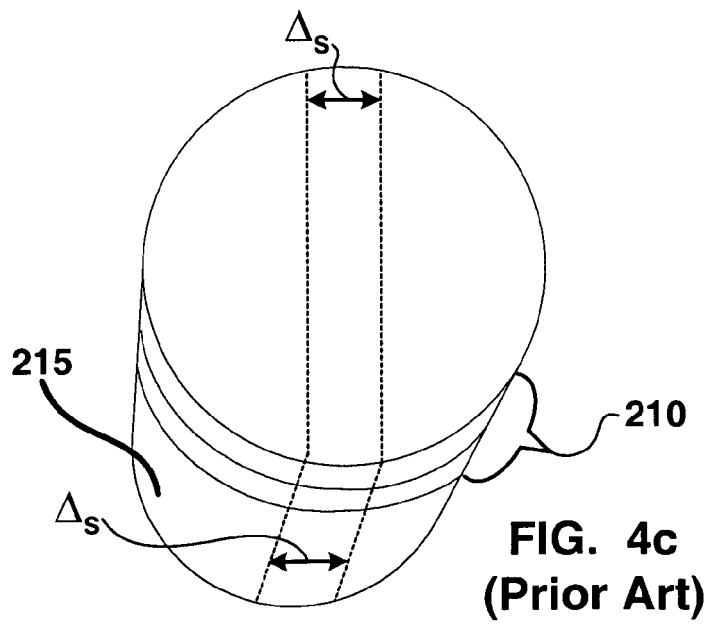
FIG. 4c is a profile view of a prior substrate prior to being sliced into discrete segments.
Figure 5A:
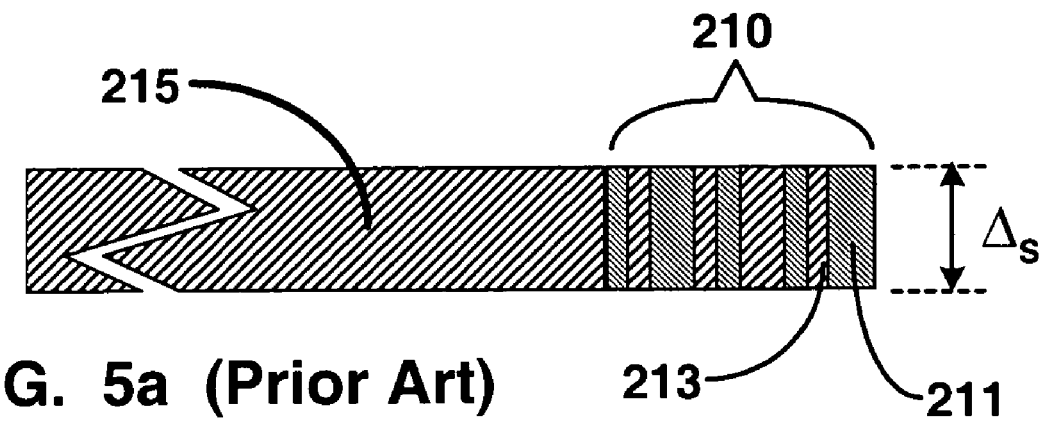
FIGS. 5a through 5c are cross-sectional views of a discrete segment of a prior imprint stamp that has been selectively etched to define simple line and space imprint patterns.
Figure 5B:
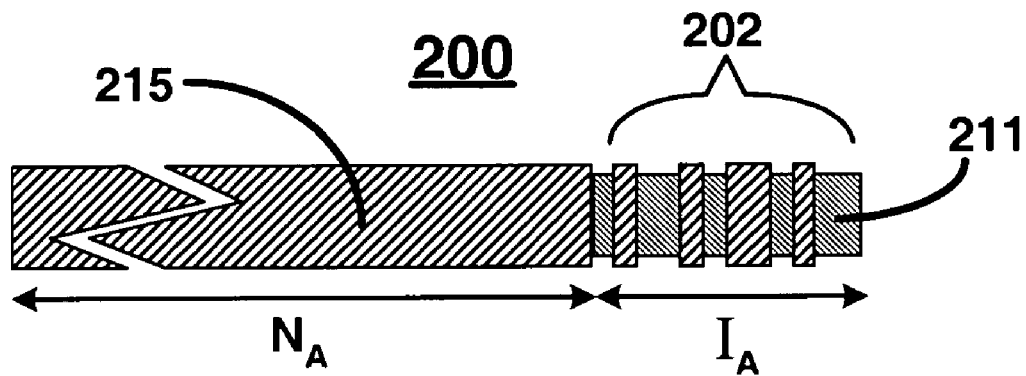
Figure 5C:
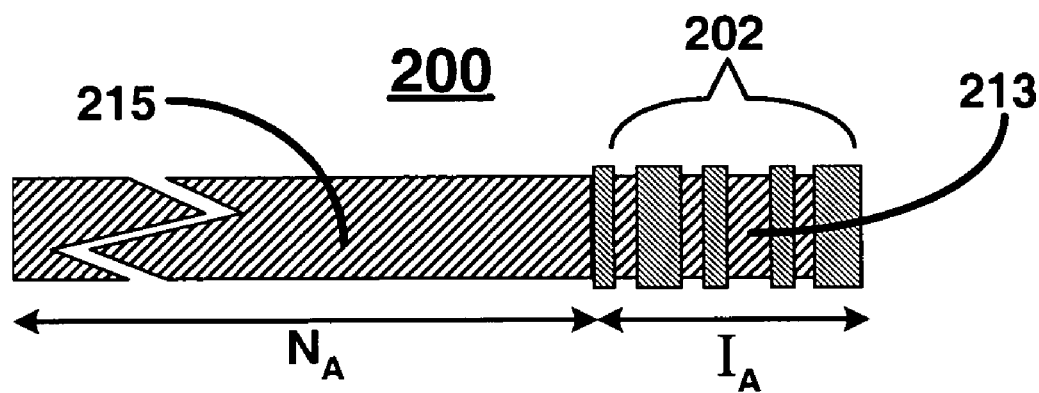
Figure 6:
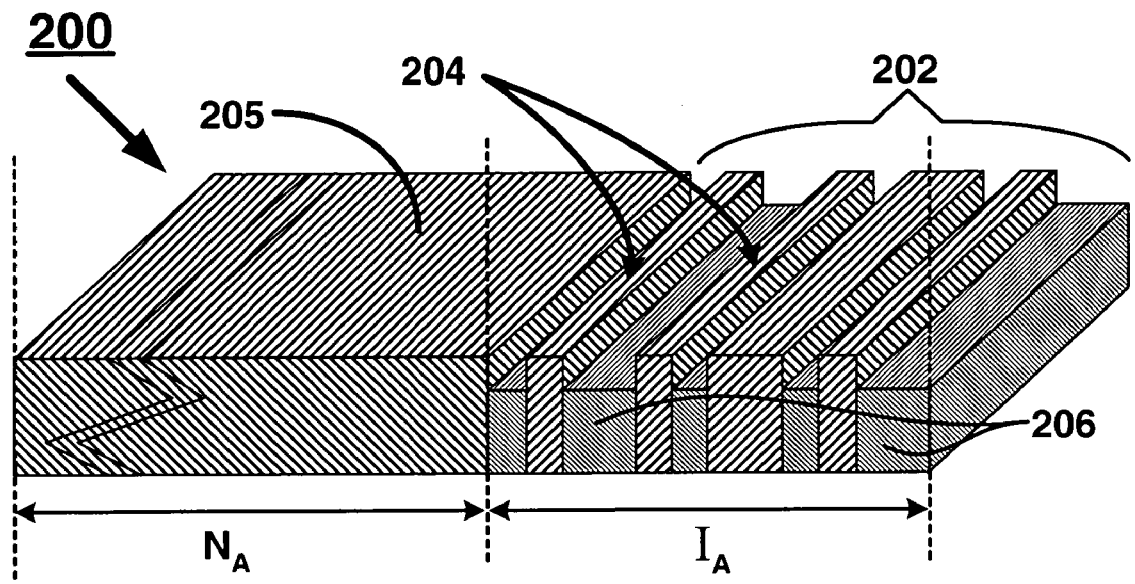
FIG. 6 is a profile view depicting an imprint area and a non-patternable area of the prior imprint stamp.
Figure 7A:
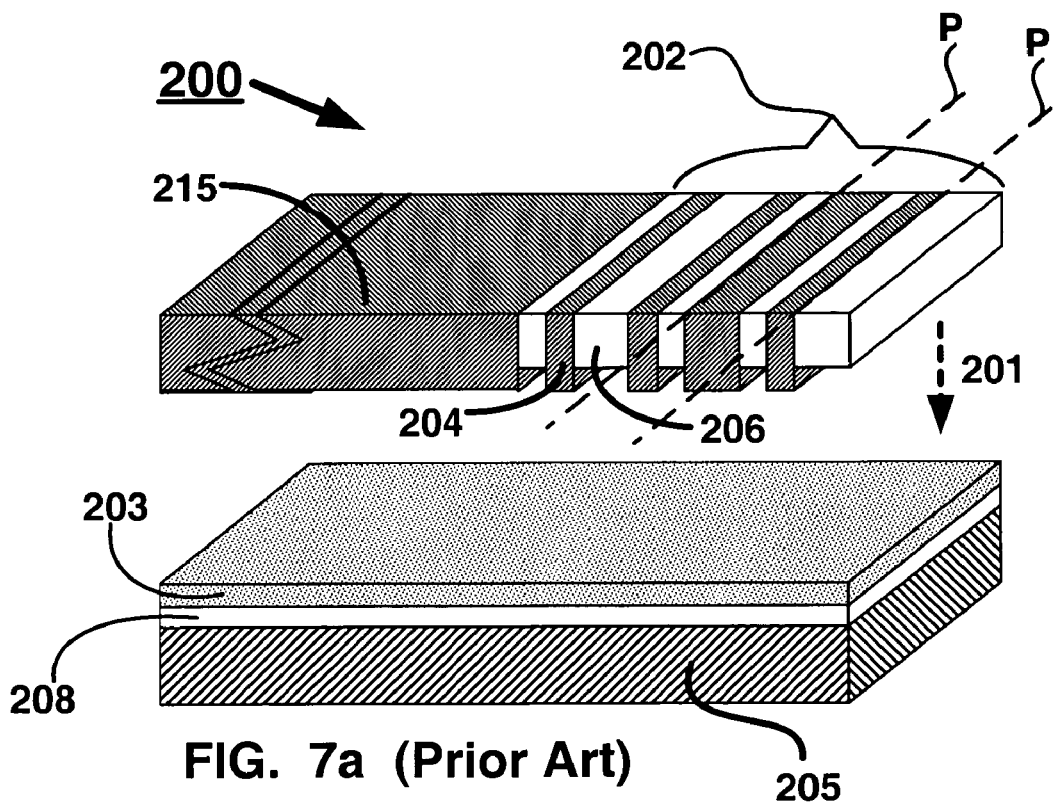
FIGS. 7a through 7d depict a prior process for pressing the prior imprint stamp into a prior mask layer to form patterns therein.
Figure 7B:
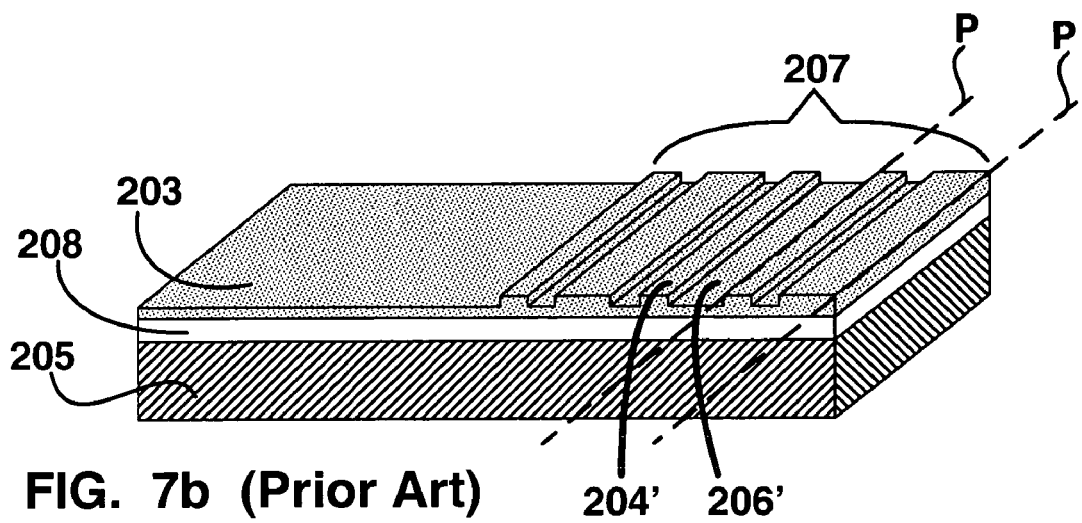
Figure 7C:
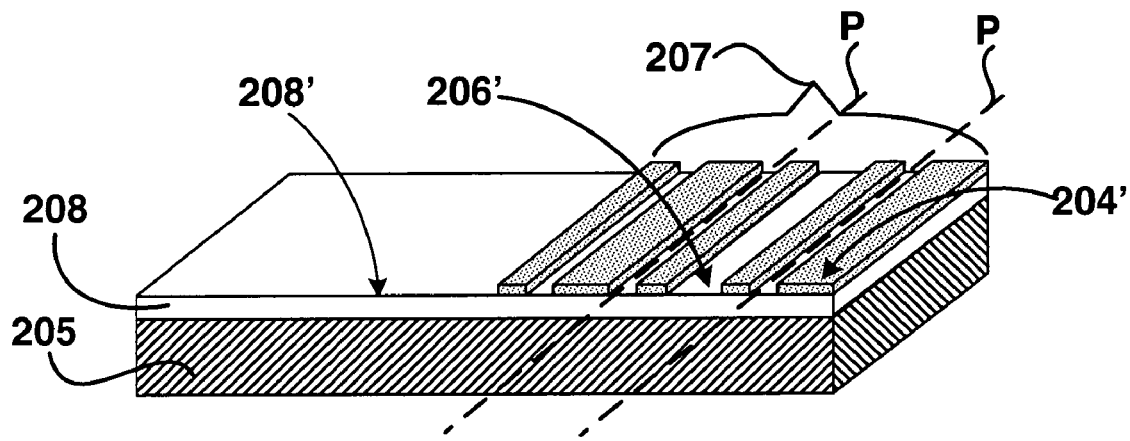
Figure 7D:
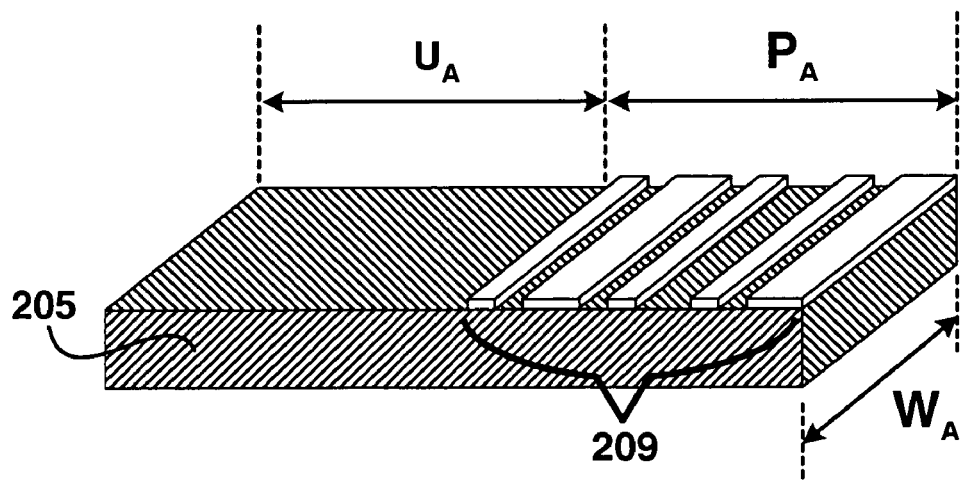
Figure 8A:
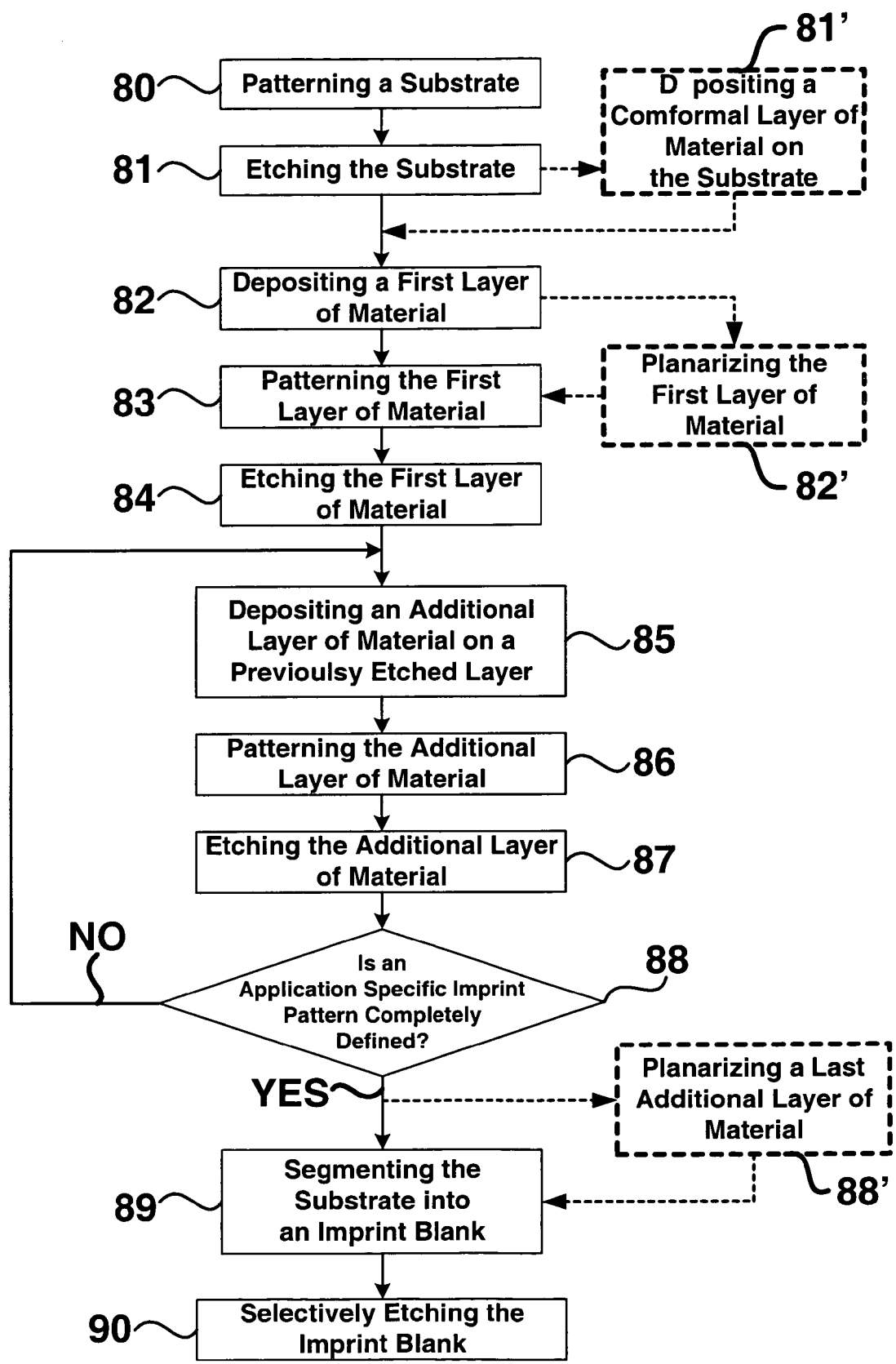
FIG. 8a is a flow diagram depicting a method of making an imprint stamp.

As shown in the drawings for purpose of illustration, the present invention is embodied in a method of fabricating an imprint stamp. In FIG. 8a, a first embodiment of a method of fabricating an imprint stamp includes patterning 80 a substrate and then etching 81 the substrate to form a pattern in the substrate. A first layer of material is deposited 82 on the substrate. The first layer of material is patterned 83 and then etched 84 to form a portion of an application specific imprint pattern in the first layer of material. The portion of the application specific imprint pattern includes a variation in a topography of the first layer of material. An additional layer of material is deposited 85 on a previously etched layer of material (e.g. the first layer of material). The additional layer of material is patterned 86 and then etched 87 to form an additional portion of the application specific imprint pattern in the additional layer of material. The additional portion the application specific imprint pattern includes a variation in a topography of the additional layer of material. The depositing of additional layers of material 85, the patterning 86, and the etching 87 are repeated 88 until the application specific imprint pattern is completely defined and comprises a plurality of features that are defined by the variations in the topographies of all of the layers of material that were deposited (81', 82, 85) patterned (80, 83, 86), and etched (81, 84, 87). The substrate is segmented 89 to form an imprint blank that includes the application specific imprint pattern on an exposed cross-sectional surface of the imprint blank. The exposed cross-sectional surface of the imprint blank is selectively etched 90 to form an imprint stamp. Optionally, after the etching 81 of the substrate, a conformal layer of material is deposited 81' on the substrate. As another option, after the first layer of material is deposited 82, the first layer of material can be planarized 82'. As yet another option, after the application specific imprint pattern is completely defined 88, a last of the additional layers of material is planarized 88'.

Figure 8B:
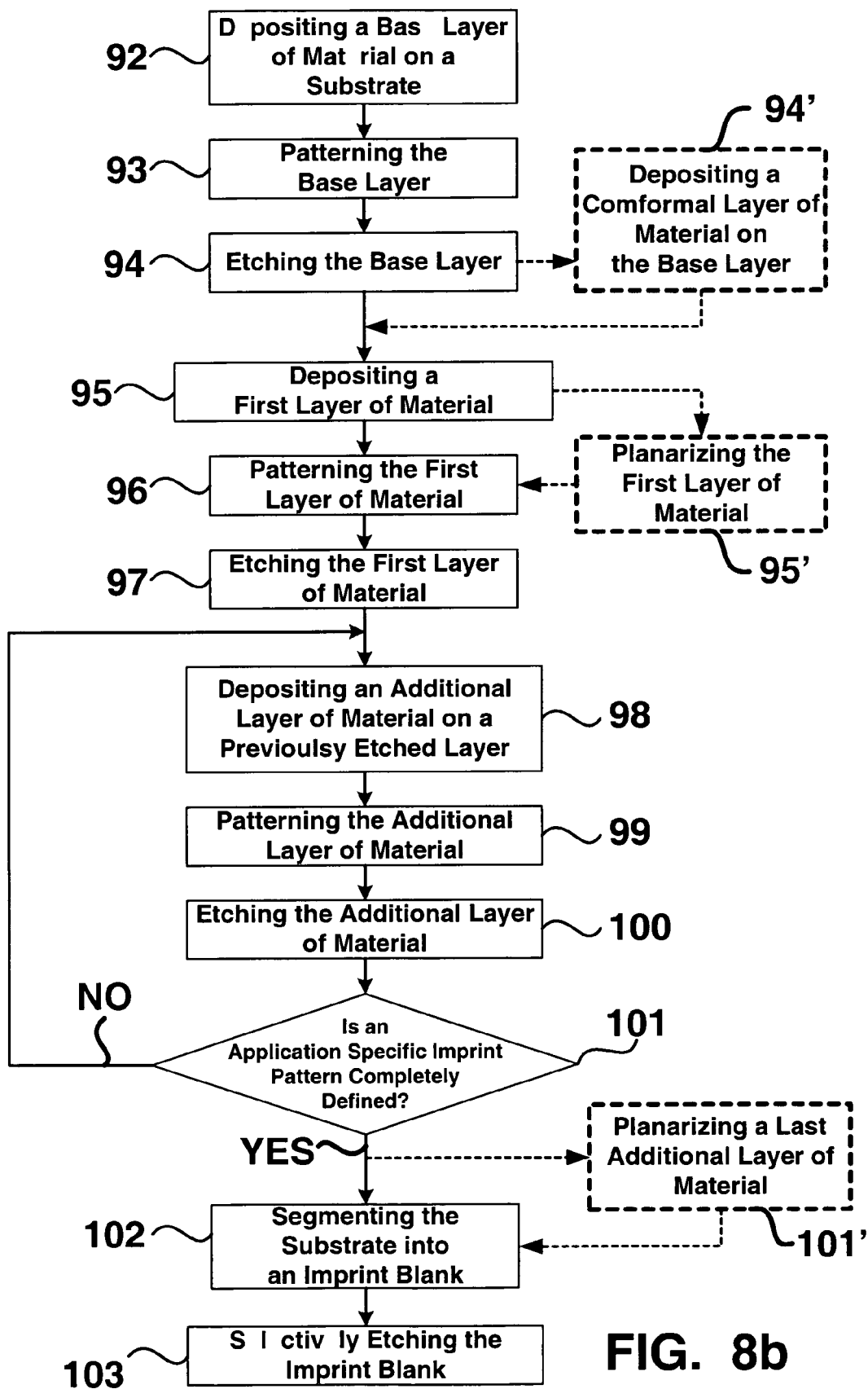
FIG. 8b is a flow diagram depicting an alternative method of making an imprint stamp.

In FIG. 8b, a second embodiment of a method of fabricating an imprint stamp includes depositing 92 a base layer of material on a substrate. The base layer of material is patterned 93 and then etched 94 to form a pattern in the base layer of material. A first layer of material is deposited 95 on the base layer of material. The first layer of material is patterned 96 and then etched 97 to form a portion of an application specific imprint pattern in the first layer of material. The portion of the application specific imprint pattern includes a variation in a topography of the first layer of material. An additional layer of material is deposited 98 on a previously etched layer of material (e.g. the first layer of material). The additional layer of material is patterned 99 and then etched 100 to form an additional portion of the application specific imprint pattern in the additional layer of material. The additional portion the application specific imprint pattern includes a variation in a topography of the additional layer of material. The depositing of additional layers of material 98, the patterning 99, and the etching 100 are repeated 101 until the application specific imprint pattern is completely defined and comprises a plurality of features that are defined by the variations in the topographies of all of the layers of material that were deposited (94', 95, 98), patterned (93, 96, 99), and etched (93, 97, 100). The substrate is segmented 102 to form an imprint blank that includes the application specific imprint pattern on an exposed cross-sectional surface of the imprint blank. The exposed cross-sectional surface of the imprint blank is selectively etched 103 to form an imprint stamp. Optionally, after the etching 94 of the base layer of material, a conformal layer of material is deposited 94' on the base layer of material. As another option, after the first layer of material is deposited 95, the first layer of material can be planarized 95'. As yet another option, after the application specific imprint pattern is completely defined 101, a last of the additional layers of material is planarized 101'.

Figure 9A:
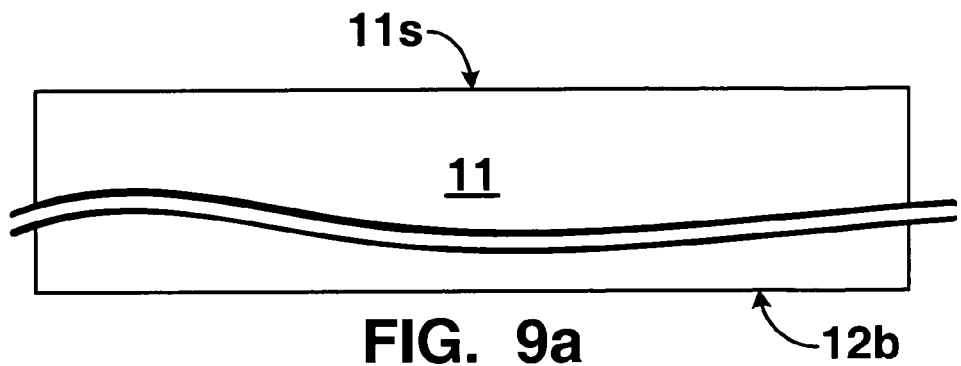
FIGS. 9a and 9b are cross-sectional views depicting a substrate.

In FIG. 9a, a substrate 11 can include a surface 11s and a bottom surface 12b. Preferably, the surface 11s and the bottom surface 12b are substantially planar surfaces. The substrate 11 can be made from a material including but not limited to a glass, a heat and chemical resistant glass such as a borosilicate glass (e.g. a PYREX® borosilicate glass), a silicon oxide ($SiO_2$), a silicon nitride ($Si_3N_4$), an aluminum oxide ($Al_2O_3$), an indium phosphide (InP), and a semiconductor material. The semiconductor material can be a material including but not limited a wafer of a semiconductor material, silicon (Si), and a silicon wafer. The silicon can be single crystal silicon (Si).

Figure 9B:
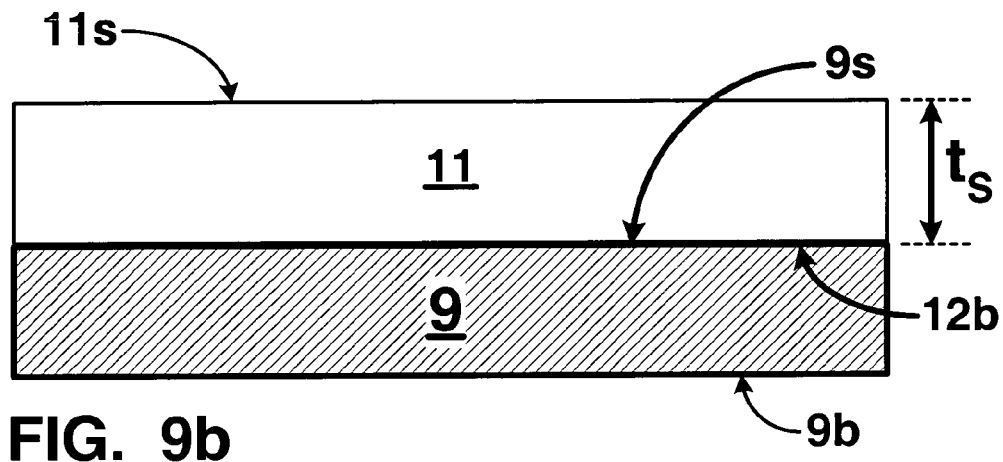

In FIG. 9b, the substrate 11 can be connected with a handling substrate 9. The handling substrate 9 can be made from a material including but not limited to the materials listed above for the substrate 11. The substrate 11 can be deposited or grown on the handling substrate 9. For example if the substrate 11 is silicon oxide ($SiO_2$) and the handling substrate 9 is made from silicon (Si), then the silicon oxide ($SiO_2$) can be grown on a surface 9s of the handling substrate 9 using an oxidation process comprising oxygen ($O_2$) to form the silicon oxide ($SiO_2$). Optionally, after the oxidation process, the surface 11s can be planarized using a process including but not limited to chemical mechanical planarization (CMP) in order to obtain a substantially planar surface. As will be described below, a substantially planar surface is desirable for subsequent patterning steps. Preferably, the surface 9s and a bottom surface 9b of the handling substrate 9 are substantially planar surfaces.

Figure 9C:
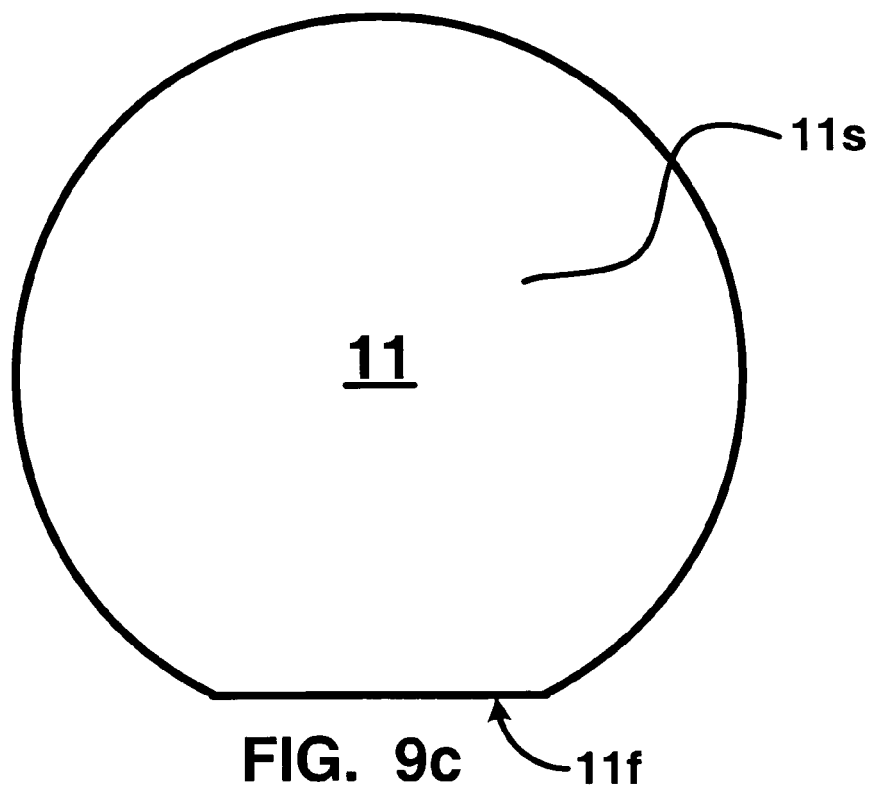
FIG. 9c is a top plan view depicting a wafer substrate.

As described above, in FIG. 9c, the substrate 11 can be a wafer of a semiconductor material (e.g. silicon Si) such as the type used as a starting material for microelectronic devices. The wafer can include a wafer flat 11f. The surface 11s may be inherently flat or the surface 11s can be planarized to form a substantially planar surface. One of ordinary skill in the art will appreciate that the handling substrate 9 can also be a silicon wafer and the substrate 11 can be deposited or grown on the handling substrate 9 as was described above. One advantage to using a wafer of a semiconductor material is that the surfaces (11s, 12b, 9s, and 9b) are typically substantially planar surfaces formed during a manufacturing of the wafer. Moreover, as will be described below, one or more of the substrates 11 can be connected with a master substrate at a later stage in the fabrication of the imprint stamp.

Figure 10:
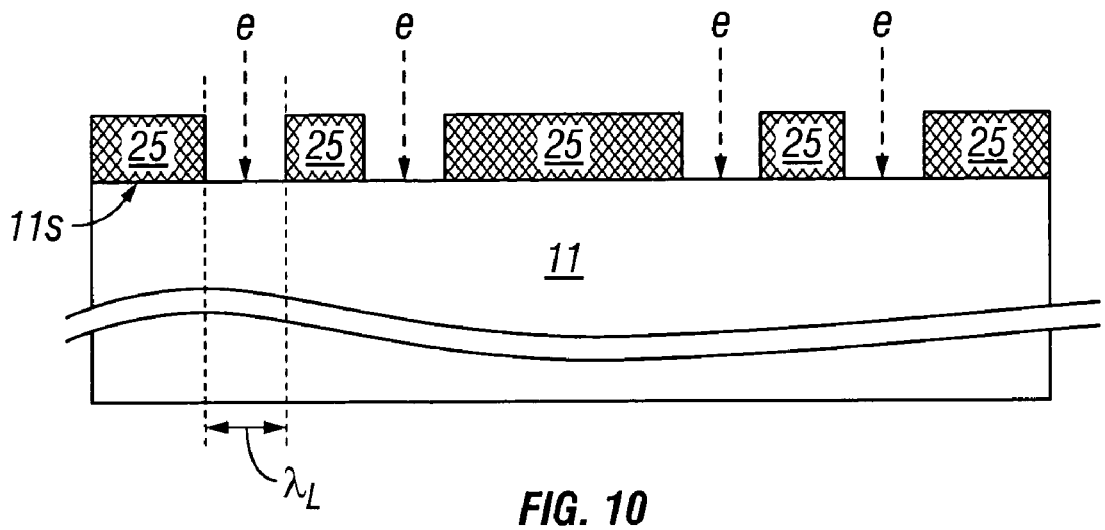
FIG. 10 is a cross-sectional view depicting a patterning and an etching of a substrate.

In FIG. 10 and referring to FIG. 8a, at a stage 80, the substrate 11 is patterned. The patterning can be accomplished using photolithographic processes that are well understood in the microelectronics art. For example, a photoresist material 25 can be deposited on the surface 11s and then exposed through a mask (not shown) to transfer a pattern to the photoresist material 25. After the exposing, the photoresist material 25 is then developed to render the pattern. Consequently, some portions of the surface 11s will be covered by the photoresist material 25; whereas, other portions of the surface 11s will not be covered by the photoresist material 25. Those portions of the photoresist material 25 that remain define an etch mask. Hereinafter, the etch mask will be denoted as reference numeral 25 and other layers of material that will be described below can be patterned and etched in a manner similar to the substrate 11.

Figure 11:
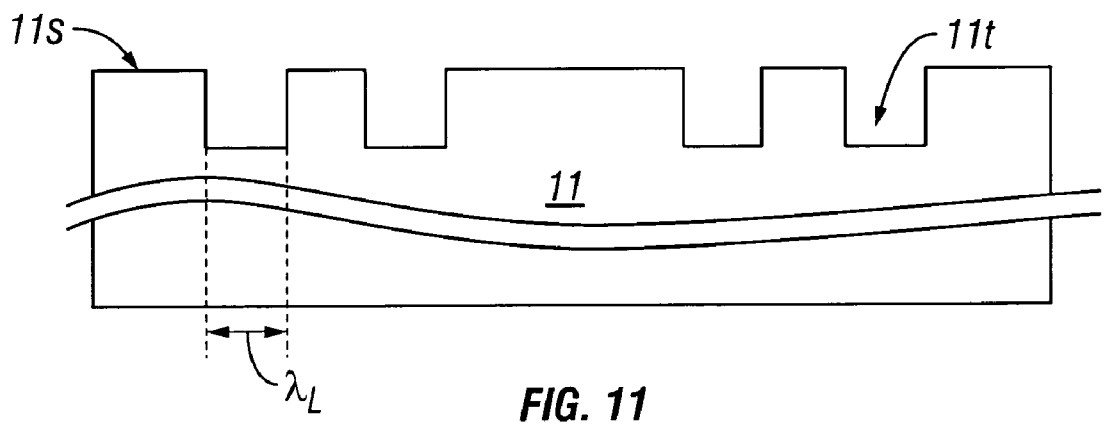
FIG. 11 is a cross-sectional view depicting a patterned substrate.

In FIG. 10, at a stage 81 the substrate 11 is etched e to form a pattern in the substrate 11. In FIG. 11, the pattern can include trenches 11t formed in the substrate 11 and extending inward of the surface 11s. The patterns formed in the substrate 11 will have a feature size that is greater than or equal to a minimum resolution $\lambda_L$ of the lithographic system that was used to pattern the substrate 11.

Figure 12A:
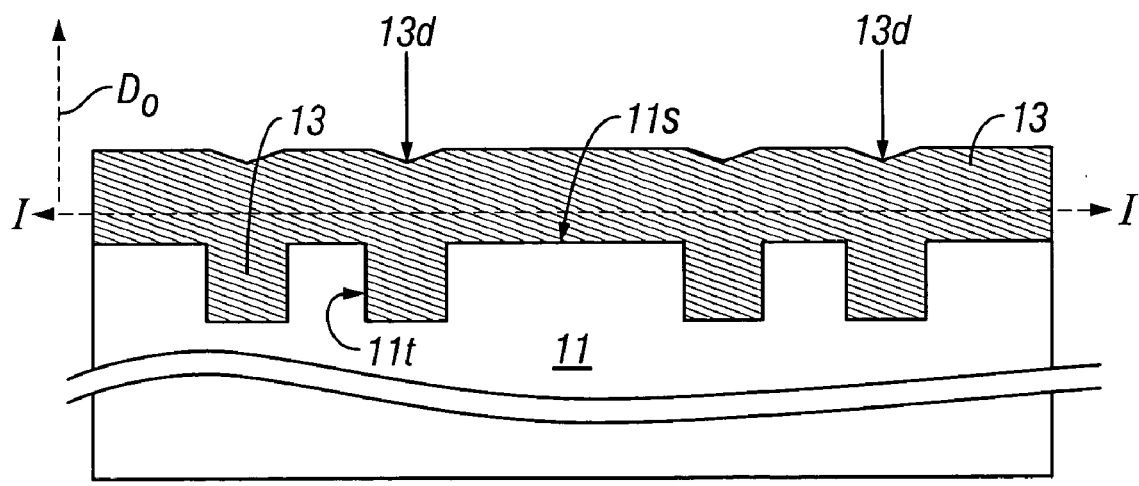
FIG. 12a is a cross-sectional view depicting a depositing of a first layer of material on a patterned substrate.

In FIG. 12a, at a stage 82, a first layer of material 13 is deposited on the substrate 11. The first layer of material 13 is one of a plurality of layers of material that will be deposited in a deposition order $D_O$. In FIG. 12c, at a stage 83, the first layer of material 13 is patterned with an etch mask 25. At a stage 84 the first layer of material 13 is etched e form a portion of an application specific imprint pattern in the first layer of material 13. The portion includes a variation in a topography of the first layer of material 13.

Figure 12B:
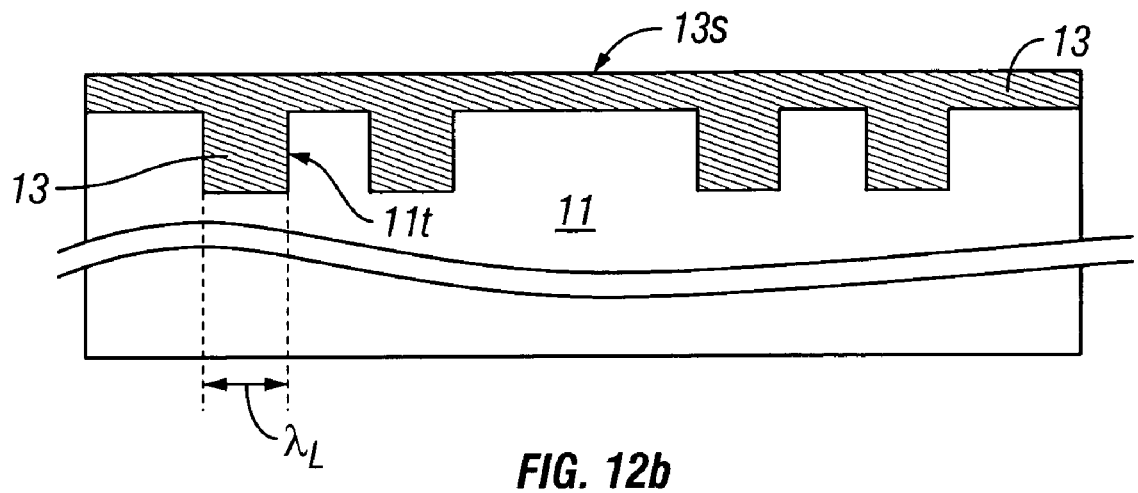
FIG. 12b is a cross-sectional view depicting a first layer of material after a planarization process.
Figure 12C:
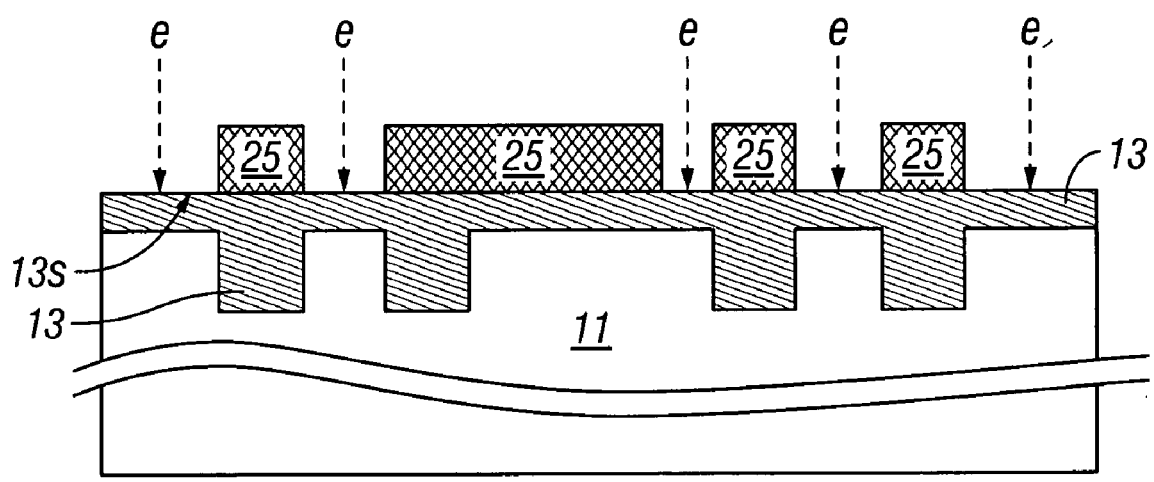
FIG. 12c is a cross-sectional view depicting a patterning and an etching of a first layer of material.
Figure 12D:
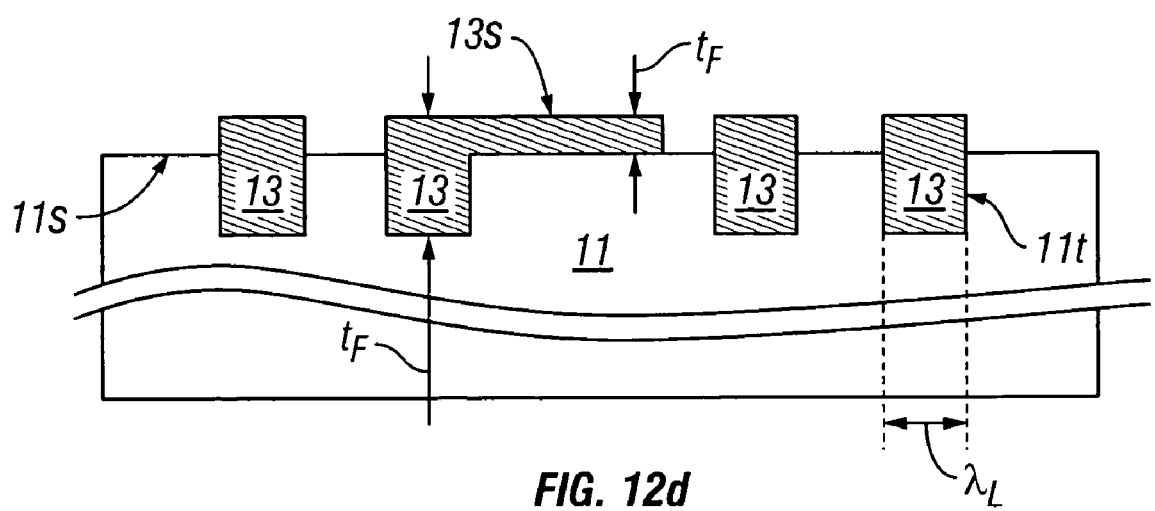
FIG. 12d is a cross-sectional view depicting a pattern formed in a first layer of material and including variations in a topography of the first layer of material.

In FIG. 12d, the variations in the topography of the first layer of material 13 can include discrete segments of the first layer of material 13 created by the etching e at the stage 84. Some of the discrete segments 13 fill the trenches 11t and extend outward of the surface 11s and some of the discrete segments 13 are disposed on the surface 11s. For example, an L-shaped discrete segment 13 that includes a portion disposed in the trench 11t and a portion that is disposed on the surface 11s. Moreover, the variations in the topography includes variations in a thickness $t_F$ of the discrete segments 13.

For example, the L-shaped discrete segment 13 includes the portion disposed on the surface 11s and having a thickness $t_F$ that is less than a thickness $t_F$ of the portion that is disposed in the trench 11t. Consequently, the discrete segment 13 is non-planar. That is, the discrete segment 13 is not substantially planar across an entirety of the substrate 11 and can include some portions that are planar and other portions that are non-planar so that taken as a whole, the discrete segment 13 is non-planar.

Optionally, in FIGS. 12a and 12b, prior to the patterning at the stage 83, at a stage 82', the first layer of material 13 can be planarized to form a substantially planar surface 13s. For example, a process such as CMP can be used to planarize the first layer of material 13. The first layer of material 13 can be planarized along a line I—I. The line I—I can run parallel to the surface 11s. In some applications, it may be desirable to have a substantially planar surface upon which to deposit and lithographically pattern the material that will be used for the etch mask 25. Planarization is particularly effective at removing a depression 13d (see FIG. 12a) that is formed over the trench 11t during the depositing of the first layer of material 13.

However, because the portion of the application specific imprint pattern in the first layer of material 13 includes the variation in the topography of the first layer of material 13, it may be desirable to allow the depressions 13d to remain so that the depressions 13d are a part of the variation in the topography of the first layer of material 13. Moreover, as will be described below, when additional layers of material are deposited over the first layer of material 13, the depressions 13d can be used to form variations in the topography of those additional layers of material so that the application specific imprint pattern is intended to include a topographical effect caused by the depressions 13d in the first layer of material 13 and in the additional layers of material that are subsequently deposited in the deposition order $D_O$. For example, if the additional layers of material are very thin, then the topographical effect caused by the depressions 13d can propagate into several layers of the additional layers of material (see 13d and 15d in FIG. 31c). During the patterning of the additional layers of material, the etch mask 25 can be positioned to prevent the depressions (13d, 15d, etc.) from being etched away during the etching process e.

Figure 13A:
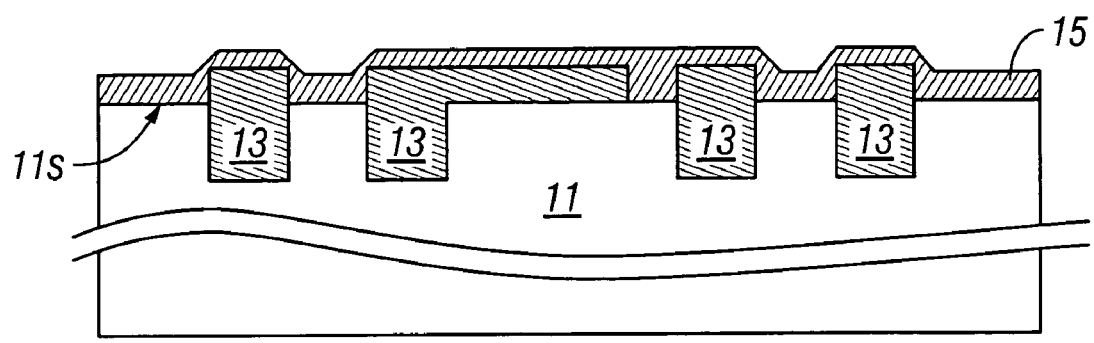
FIG. 13a is a cross-sectional view depicting a depositing of an additional layer of material on a previously deposited layer of material.
Figure 13B:
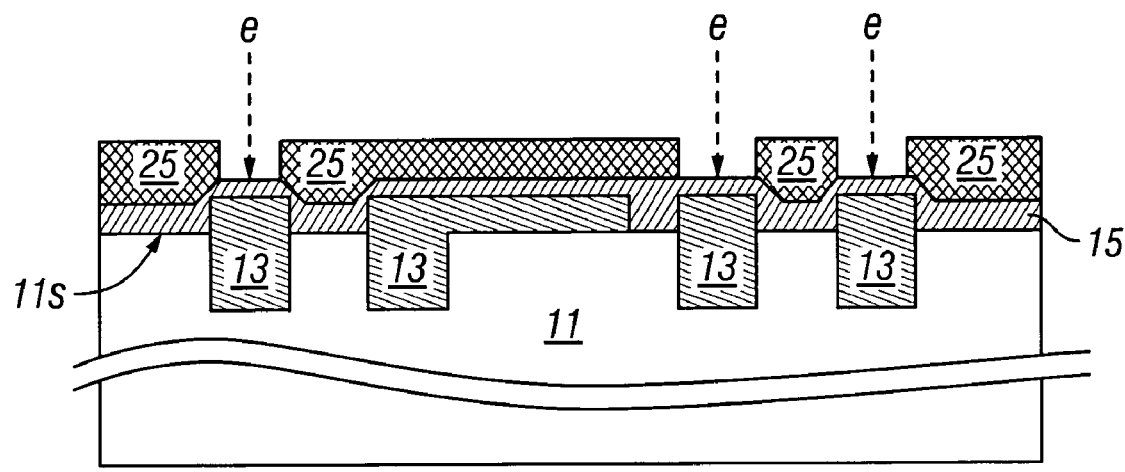
FIG. 13b is a cross-sectional view depicting a patterning and an etching of an additional layer of material.

In FIG. 13a, at a stage 85, an additional layer of material 15 is deposited on a previous etched layer of material. In FIG. 13a, the previously etched layer of material is the first layer of material 13; however, the previously etched layer of material can be any layer of material that was previously deposited, patterned, and then etched in the deposition order $D_O$. In FIG. 13b, at a state 86, the additional layer of material 15 is patterned with an etch mask 25. At a stage 87, the additional layer of material 15 is etched e to form an additional portion of the application specific imprint pattern in the additional layer of material 15. The additional portion includes a variation in a topography of the additional layer of material 15.

Figure 13C:
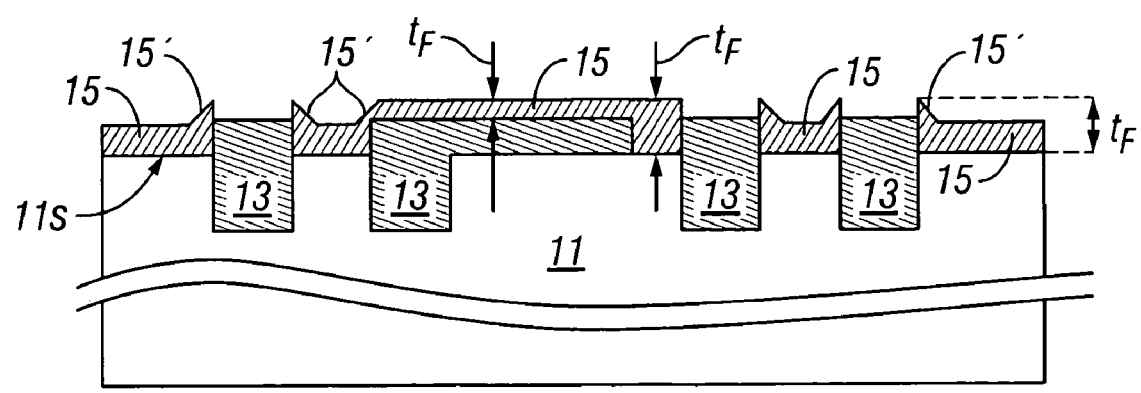
FIG. 13c is a cross-sectional view depicting a pattern formed in an additional layer of material and including variations in a topography of the additional layer of material.

In FIG. 13c, the variations in topography can include discrete segments of the additional layer of material 15 and variations in a thickness $t_F$ of the discrete segments 15. The variations in topography can also include one or more discrete segments 15 in which at least a portion 15' of the discrete segment 15 includes an angular or arcuate shape. That is, the discrete segments 15 has variations in topography 15' and thickness $t_F$ that result in the discrete segments 15 being non-planar.

Figure 14A:
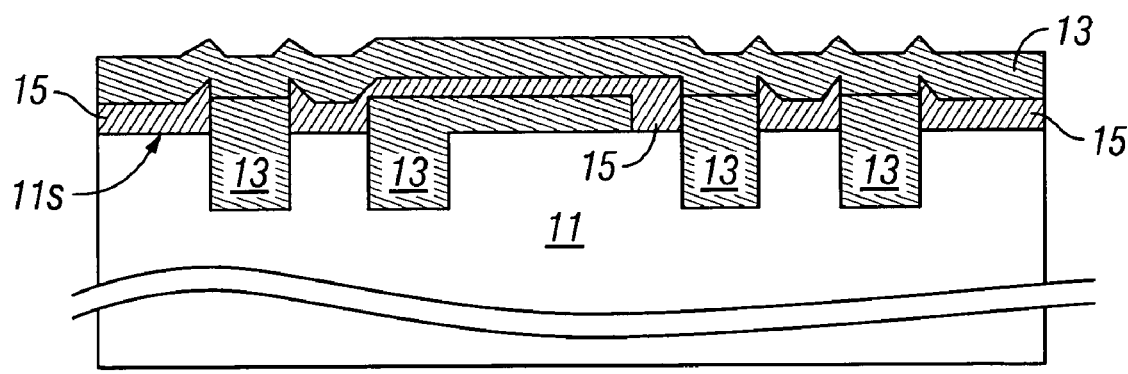
FIG. 14a is a cross-sectional view depicting a depositing of an additional layer of material on previously deposited layers of material.
Figure 14B:
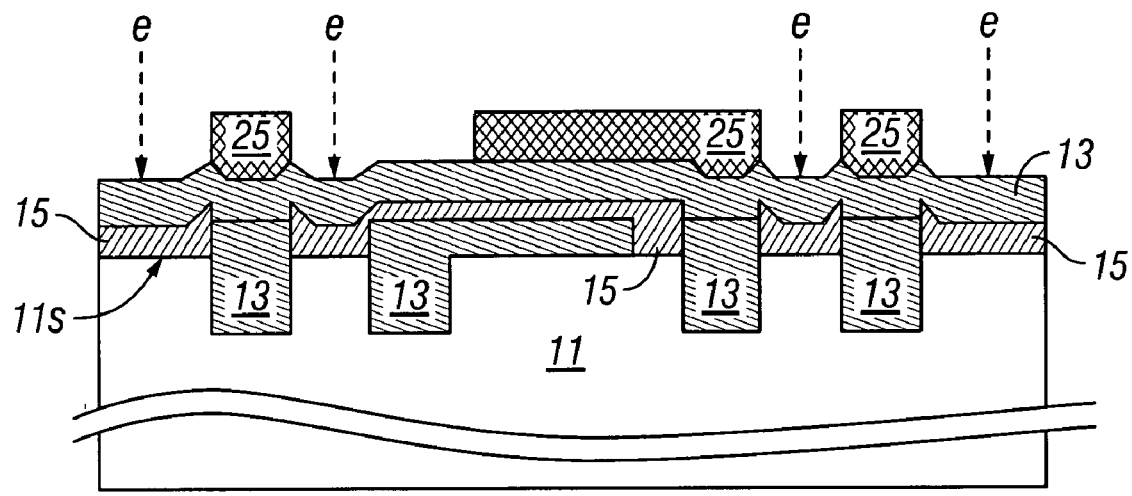
FIG. 14b is a cross-sectional view depicting a patterning and an etching of an additional layer of material.

In FIG. 14a, at a stage 88, the application specific imprint pattern is not completely defined, accordingly, the stage 85 is repeated, and an additional layer of material 13 is deposited on a previous etched layer of material. Although the additional layer of material is denoted as 13, the additional layer of material need not be the same type of material that was used for the first layer of material 13. In FIG. 14b, at a stage 86, the additional layer of material 13 is patterned with an etch mask 25. At a stage 87, the additional layer of material 13 is etched e to form an additional portion of the application specific imprint pattern in the additional layer of material 13. As described above, the additional portion includes a variation in a topography of the additional layer of material 13.

Figure 14C:
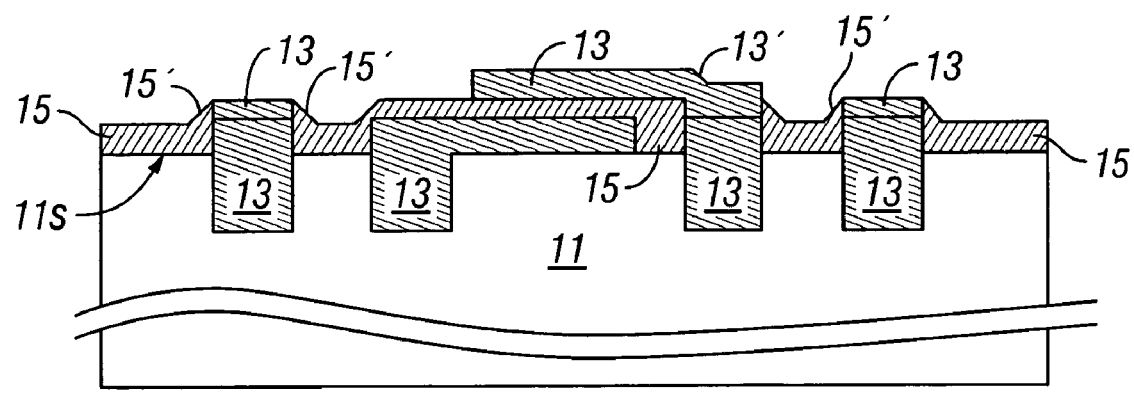
FIG. 14c is a cross-sectional view depicting a pattern formed in an additional layer of material and including variations in a topography of the additional layer of material.
Figure 15A:
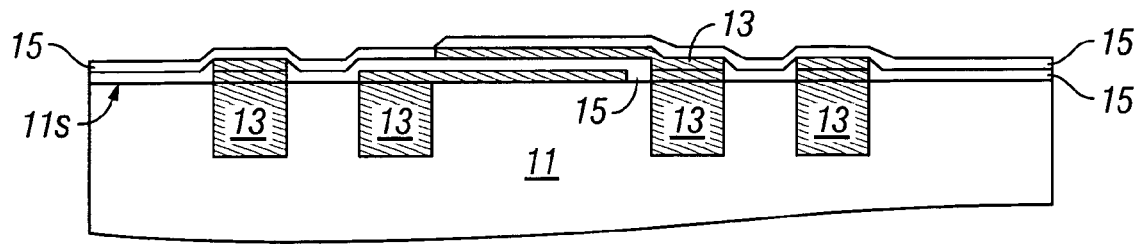
FIGS. 15a and 15b are cross-sectional views depict respectively a depositing of an additional layer of material on previously deposited layers of material and a pattern formed in the additional layer of material and including variations in a topography of the additional layer of material.
Figure 15B:
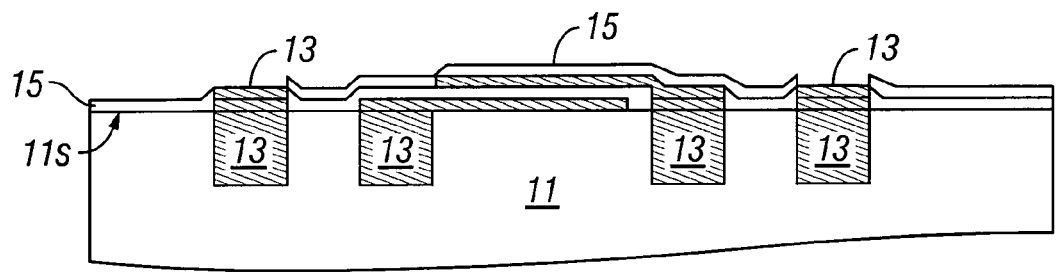
Figure 16A:
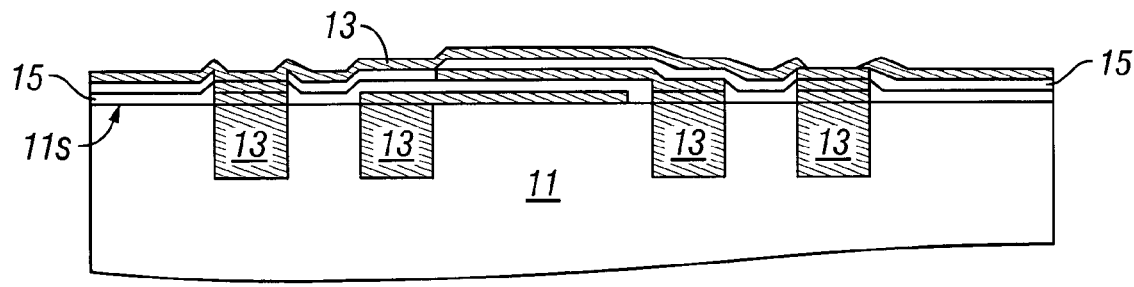
FIGS. 16a and 16b are cross-sectional views depict respectively a depositing of an additional layer of material on previously deposited layers of material and a pattern formed in the additional layer of material and including variations in a topography of the additional layer of material.
Figure 16B:
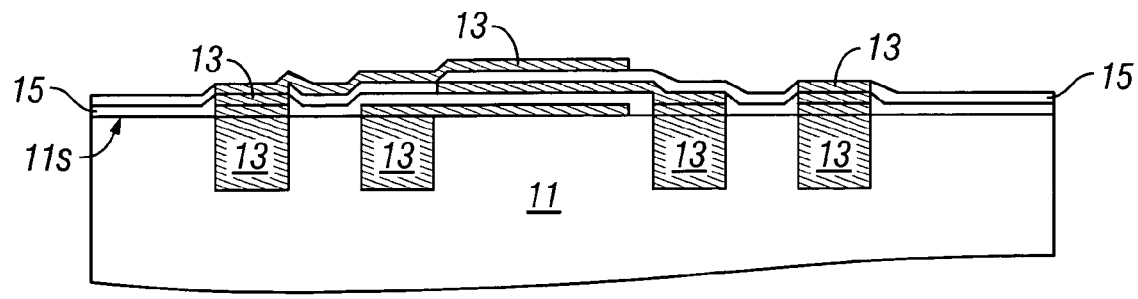

In FIG. 14c, the variations in topography can include discrete segments of the additional layer of material 13 and variations in a thickness $t_F$ of the discrete segments 13. The variations in topography can also include one or more discrete segments 13 in which at least a portion 13' of the discrete segment 13 includes an angular or arcuate shape so that the discrete segments 13 includes variations in topography 13' and thickness $t_F$ that result in the discrete segments 13 being non-planar.

In FIGS. 15a through 18b, the depositing of additional layers of material (13, 15) at the stage 85, the patterning (not shown) at the stage 86, and the etching (not shown) at the stage 87 are repeated until the application specific imprint pattern is completely defined at the stage 88 and the application specific imprint pattern includes a plurality of features that are defined by the variations in the topographies of all of the layers of material (13, 15) that were deposited, patterned, and etched as described above.

Figure 17A:
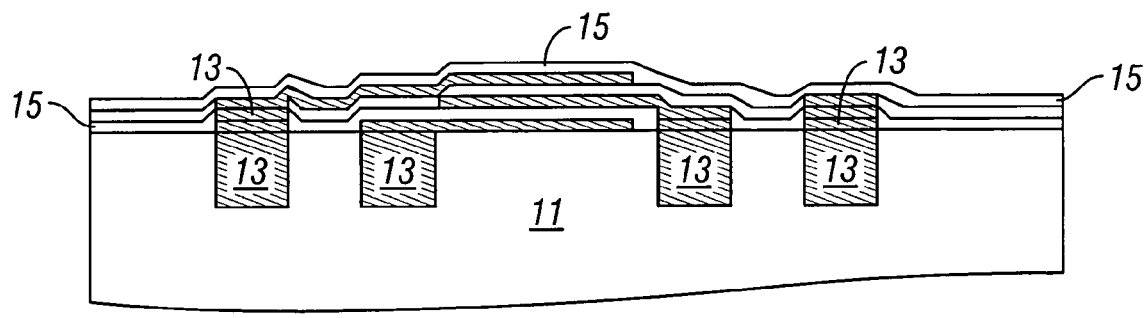
FIGS. 17a and 17b are cross-sectional views depict respectively a depositing of an additional layer of material on previously deposited layers of material and a pattern formed in the additional layer of material and including variations in a topography of the additional layer of material.
Figure 17B:
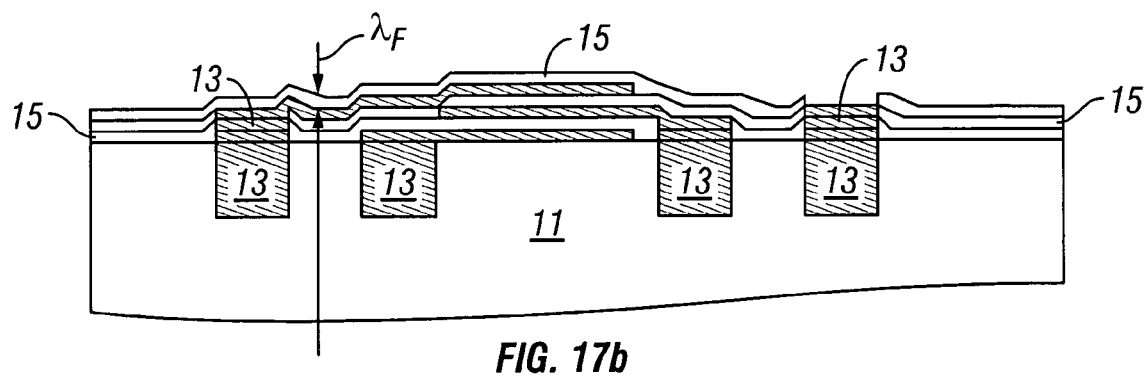
Figure 18A:
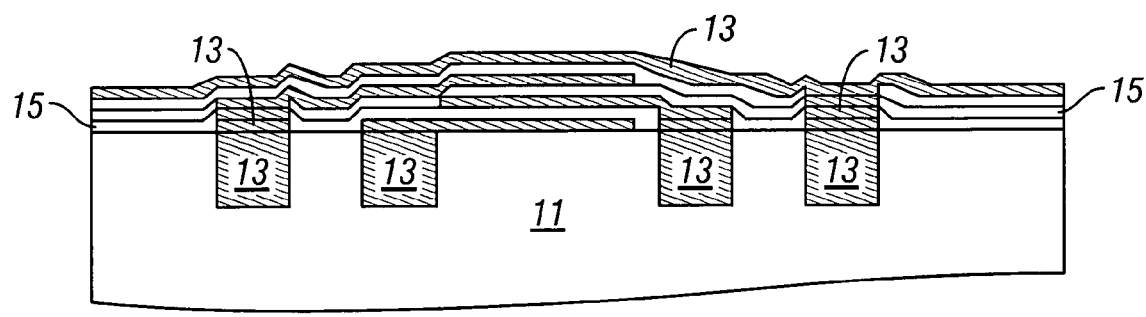
FIGS. 18a and 18b are cross-sectional views depict respectively a depositing of an additional layer of material on previously deposited layers of material and a pattern formed in the additional layer of material and including variations in a topography of the additional layer of material.
Figure 18B:
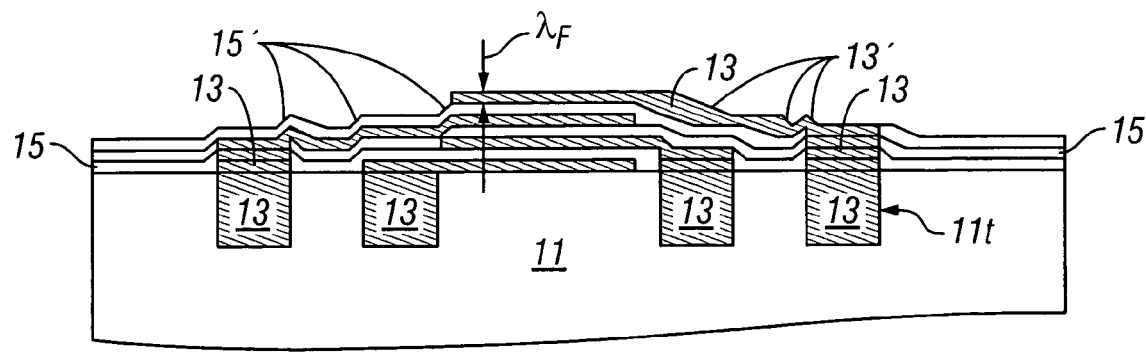

In FIGS. 17b and 18b, some of the additional layers of material (i.e. 15 and 13 respectively) that define the plurality of features in the application specific imprint pattern include a minimum a feature size $\lambda_F$ that is less than the minimum resolution $\lambda_L$ (i.e. $\lambda_F < \lambda_L$). The actual dimensions for the minimum a feature size $\lambda_F$ will be application specific. However, for some applications it is desirable for the minimum feature size $\lambda_F$ to be of a sub-micron scale (i.e. less than about 1.0 μm) and in other applications it is desirable for the minimum feature size $\lambda_F$ to be of a nanometer scale (i.e. less than about 100.0 nm). For example, the minimum feature size $\lambda_F$ can be less than about 10.0 nm.

Figure 19A:
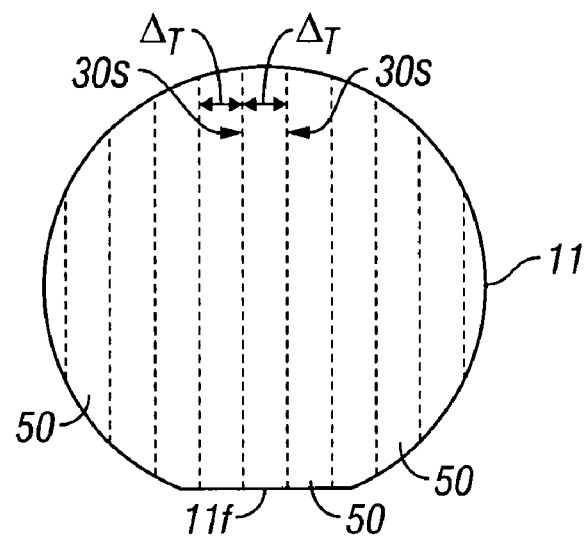
FIG. 19a is a top plan view depicting a substrate including a plurality of segment lines.
Figure 19B:
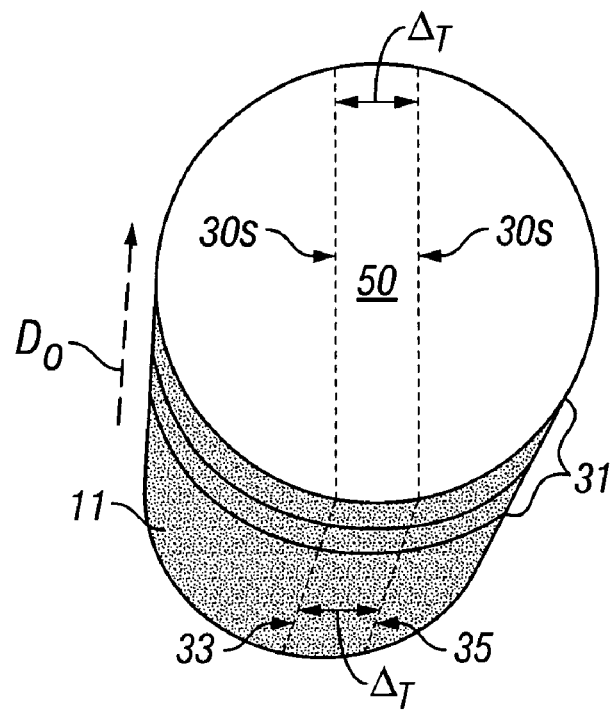
FIG. 19b is a profile view depicting a plurality of segment lines for a discrete segment of a substrate.
Figure 19C:
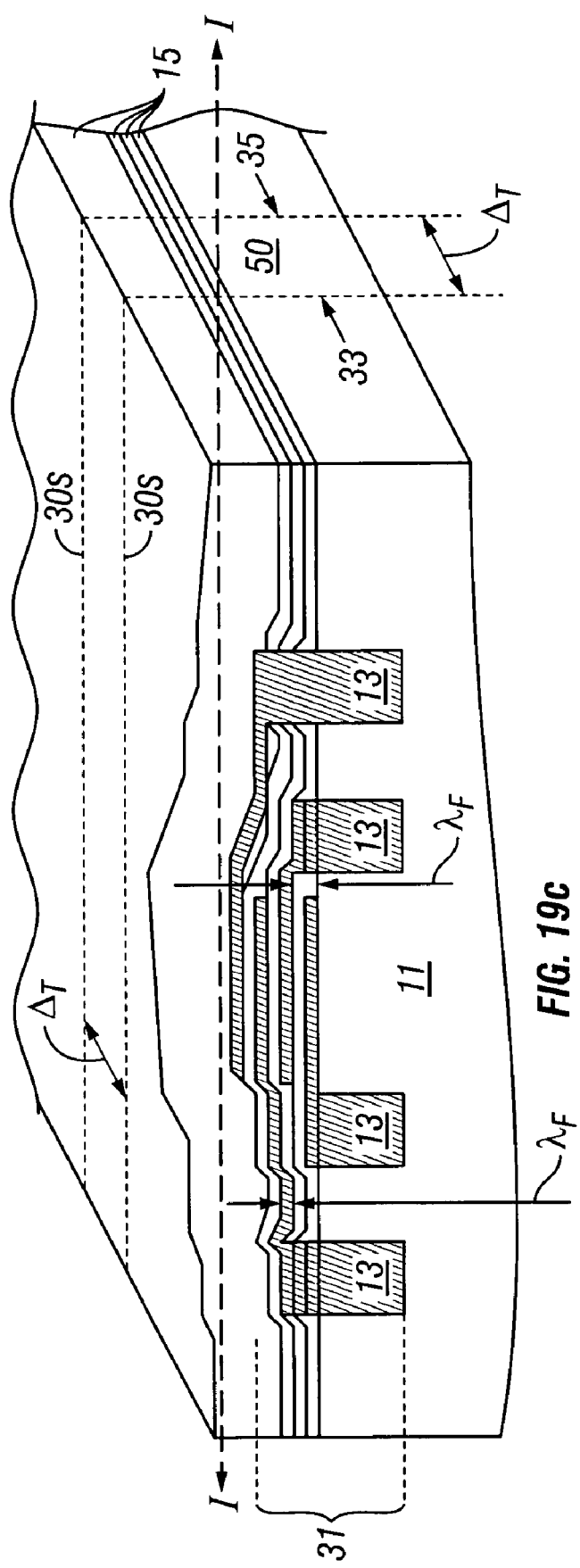
FIG. 19c is a cross-sectional view of a discrete segment that includes a plurality of layers of material including variations in a topography of the layers of material that define an application specific imprint pattern.

In FIGS. 19a and 19b, at a stage 89, the substrate 11 is segmented to form an imprint blank 50 (see FIGS. 19d, 19e, 21, 22a, and 23a) that includes the application specific imprint pattern. The substrate 11 can be partitioned into a plurality of individual segments $\Delta_T$ that include an exposed cross-sectional surface (33, 35). The partitioning can be accomplished by a process including but not limited to sawing, cutting, slicing, scribing, or the like. For example, if the substrate 11 is a wafer, then the wafer can be sliced or sawed along a scribe line 30s to form the individual segments $\Delta_T$ that include the exposed cross-sectional surfaces (33, 35). Preferably, the substrate 11 is partitioned (e.g. sliced or sawed) along a direction that is substantially perpendicular to a surface of the substrate 11 (e.g. the bottom surface 12b). In FIG. 19c, each of the individual segments $\Delta_T$ will include all of the layers of material (denoted as 31) that were deposited, patterned, and etched on the exposed cross-sectional surface (33, 35) of the imprint blank 50. The layers of material 31 includes the layers 13 and 15 as described above.

Figure 20A:
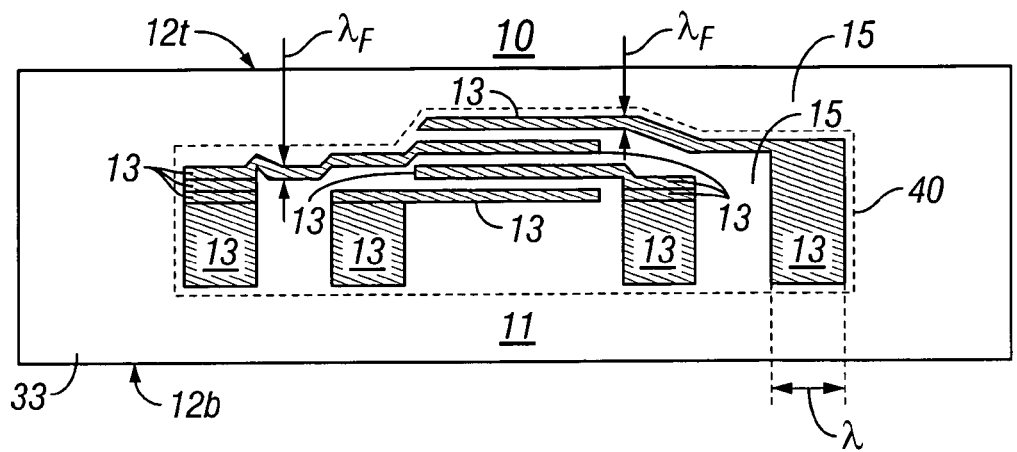
FIGS. 20a through 20c are top plan views depicting an imprint stamp formed from an imprint blank and including an application specific imprint pattern.
Figure 20B:
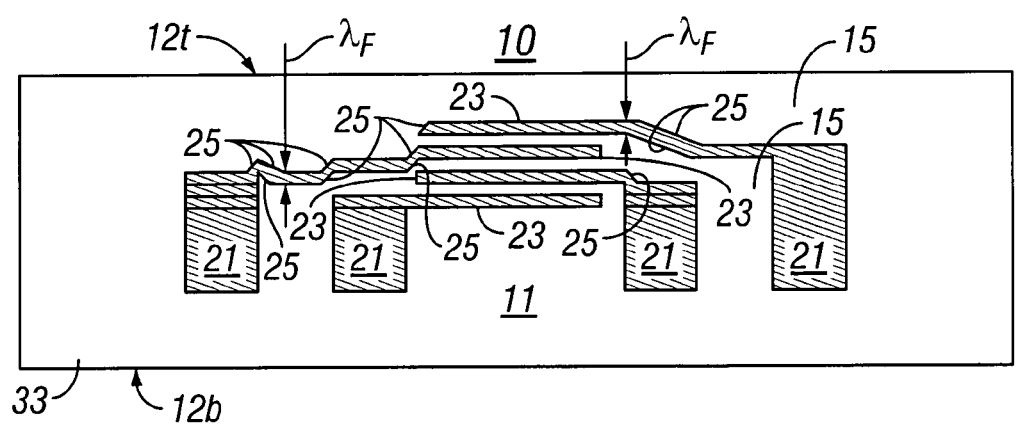

Optionally, after the application specific imprint pattern is completely defined at the stage 88, at a stage 88', a last of the additional layers of material to be deposited in the deposition order $D_O$ can be planarized so that the last of the additional layers of material has a substantially planar surface. For example, in FIG. 19c, the last of the additional layers of material is a layer 15 and the last layer 15 can be planarized along a line I—I. A process including but not limited to CMP can be used for the planarization at the stage 88'. In FIGS. 20a and 20b, the planarization the last of the additional layers of material can be used to form a top surface 12t that is substantially planar. Preferably, the top surface 12t is substantially parallel to the bottom surface 12b of the substrate 11. Prior to the partitioning of the substrate 11, the substrate 11 can be ground or polished to make the substrate 11 thinner before it is diced into the individual segments $\Delta_T$. For example, a back-grinding process can be used to thin the substrate 11. The substrate 11 may also be polished or otherwise planarized so that the bottom surface 12b is substantially flat and is substantially parallel to the top surface 12t.

In FIGS. 19d and 19, after the partitioning, an imprint blank 50 is formed and includes the layers of material (13, 15) on exposed surfaces (33, 35). Preferably, the exposed cross-sectional surfaces (33, 35) are polished using a process such as CMP so that those surfaces are smooth and substantially planar along a dashed line II—II in preparation for a selective etch of the layers of material (13, 15) as will be described below.

In FIG. 19f, the layers 15 on the exposed cross-sectional surface 33 are selectively etched so that the layers 13 stand in relief (i.e. the layers 13 extend outward of the layers 15) and form an imprint stamp 10 that includes an imprint pattern comprising a plurality of contact pads 21 and a plurality of wires 23 connected with the contact pads 21. The substrate 11 depicted in FIGS. 19a, 19b, and 19c can yield more than one imprint stamp 10 and those imprint stamps 10 can be used individually in a imprint or soft-lithography process or those imprint stamps 10 can be connected with a master substrate in an orderly pattern such as an array or in some other pattern. The imprint blanks 50 can be connected with the master substrate and then the exposed cross-sectional surfaces 33 or 35 can be selectively etched as described above.

Accordingly, in FIG. 19g an adhesive, glue, or the like can be applied to the exposed cross-sectional surface 35 of the imprint stamp 10. Subsequently, in FIG. 19h, a plurality of imprint stamps 10 can be connected with a surface 41t of a master substrate 41. The imprint stamps 10 can be arranged in an orderly pattern such as in rows and columns of an array or in an irregular pattern. A precision pick-and-place machine can be used to accurately position the imprint stamps 10 on the surface 41t. Suitable materials for the master substrate 41 include but are not limited to a metal, a metal alloy, a glass, a heat and chemical resistant glass such as a borosilicate glass (e.g. a PYREX® borosilicate glass), a ceramic, a composite material, quartz, a semiconductor material, sapphire, and silicon (Si).

In FIG. 19h, a bottom surface 41b of the master substrate 41 can be connected with an imprint lithography system (not shown) and then used in an imprint lithography process to imprint a media (not shown) with the application specific imprint patterns carried by the imprint stamps 10. The imprint stamps 10 that are connected with the master substrate 41 need not be of the same size or the same shape, and the application specific imprint pattern can vary among the imprint stamps 10.

In FIG. 20a, an imprint stamp 10 includes an application specific imprint pattern 40 (shown in dashed line) formed on the exposed cross-sectional surface 33. The imprint stamp is formed from the imprint blank 50. The application specific imprint pattern 40 includes a plurality of features that are defined by the variations in topography of the layers of material (13, 15) that were deposited, patterned, and etched as described above. For example, the layers 13, as will be described in greater detail below in reference to FIGS. 20b and 20c, include complex shapes and patterns that define a contact pad pattern and a wire pattern that is connected with the contact pad pattern. For example, the pattern for the wires includes some planar segments and other segments that are non-planar. Similarly, the layers 15 define an area that separates the wire and contact pad patterns from one another and the layers 15 also include complex shapes and patterns. For instance, the layers 15 includes some planar segments and other segments that are non-planar.

The layers 13 and 15 can also include the minimum feature size $\lambda_F$. For example, the wires 13 can be 6.0 nm wide and a space 15 between the wires 13 can 5.0 nm wide. Furthermore, the pattern for the contact pads 13 can include a feature size $\lambda$ that can be greater than or equal to the minimum resolution $\lambda_L$ (that is $\lambda \geq \lambda_L$). On the other hand, the feature size $\lambda$ can be less than the minimum resolution $\lambda_L$ (that is $\lambda < \lambda_L$) as will be described below in reference to a conformal layer of material 12 in FIGS. 30a through 31d.

Figure 20C:
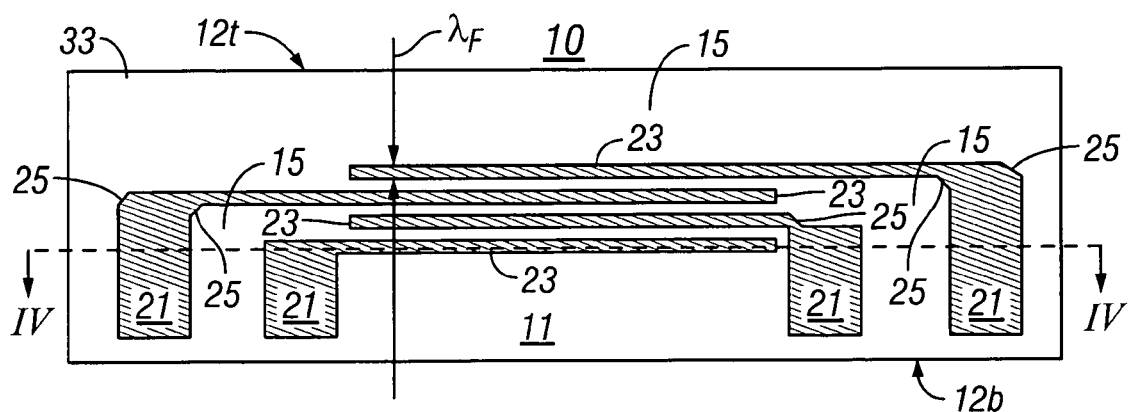

In FIGS. 20b and 20c, at a stage 90, the exposed cross-sectional surface (33, 35) of the imprint blank 50 is selectively etched e to form an imprint stamp 10. Although either one or both of the exposed cross-sectional surfaces (33, 35) can be selectively etched, typically only one of the surfaces is selectively etched. For purposes of illustration, the exposed cross-sectional surface 33 is selectively etched. The selective etching process can be an anisotropic etching process and the etch material can be selective to one or more of the layers of material 31. The etching process can be a anisotropic etch process (e.g. a plasma etch). For example, a reactive ion etching process (RIE) can be used.

In FIG. 20b, the imprint stamp 10 includes the application specific imprint pattern 40. Although the actual application specific imprint pattern 40 will be determined by the application, in FIGS. 20b and 20c, the plurality of features comprising the application specific imprint pattern 40 includes a contact pad 21 and a wire 23 connected with the contact pad 23. The plurality of features (e.g. 23) can include the minimum feature size $\lambda_F$ and the minimum feature size $\lambda_F$ can be less than about 10.0 nm. Moreover, the plurality of features include at least a portion 25 that is non-planar. For example, the wire 23 includes bends and angular portions denoted as 25. As a result, the plurality of features in the application specific imprint pattern 40 can include non-planar and complex features unlike prior imprint stamps wherein the features are substantially planar and differences in the feature size are controlled by deposition thickness. Consequently, variations in the imprint pattern of the prior imprint stamp consists of variations in thickness among the substantially planar layers.

In FIG. 20c, the imprint stamp 10 includes the plurality of features in the application specific imprint pattern 40; however, the plurality of features are less complex than those in FIG. 20b. For example, the wires 23 have substantially planar portions but also include non-planar portions denoted as 25 where the wires 21 either bend or connect with the contact pads 21. In FIGS. 20b and 20c, although the layers 13 are referred to as wires 23 and contact pads 21, the application specific imprint pattern 40 formed by the layers 13 will be used in a subsequent imprinting process to form actual electrically conductive contact pads and wires. Accordingly, the layers 13 as formed on the imprint stamp 10 may be made from a dielectric material.

In FIG. 21, a cross-sectional view of the imprint blank 50 along line A—A of FIG. 20c depicts the layers of material 31 in the application specific imprint pattern 40 in relationship to the plurality of features. For instance, the layer of material 13w corresponds to the wires 23; whereas the layers of material 13c corresponds to the contact pads 21. The layers of material 15 are positioned in between the layers 13w and 13c that define the wires 23 and contact pads 21.

In FIG. 22a, at the stage 90, the selective etching e of the imprint blank 50 includes applying an etch material that is selective to only some of the layers of material (e.g. the layer 15). In FIG. 22b, after the selective etching is completed, those layers of material (e.g. the layers 13c and 13w) that were not selectively etched stand proud of those layers that were selectively etched (e.g. the layers 15) because the layers that were selectively etched have receded below the exposed cross-sectional surface 33. As a result, the layers 13c and 13w that define the contact pads 21 and the wires 23 of the imprint stamp 10 are substantially flush with the dashed line II—II. The dashed line II—II is for reference only and is depicted as substantially flush with the exposed cross-sectional surface 33.

Conversely, in FIG. 23a, the layers 13c and 13w of the imprint blank 50 are selectively etched e so that after the etching, in FIG. 23b, the layers 13c and 13w that define the contact pads 21 and the wires 23 of the imprint stamp 10 recede below the exposed cross-sectional surface 33. Consequently, the layers 15 of the imprint stamp 10 stand proud of the layers 13c and 13w as indicated by the dashed line II—II because the dashed line II—II is substantially flush with the layers 15; whereas, the layers 13c and 13w are recessed below the dashed line II—II.

Figure 24:
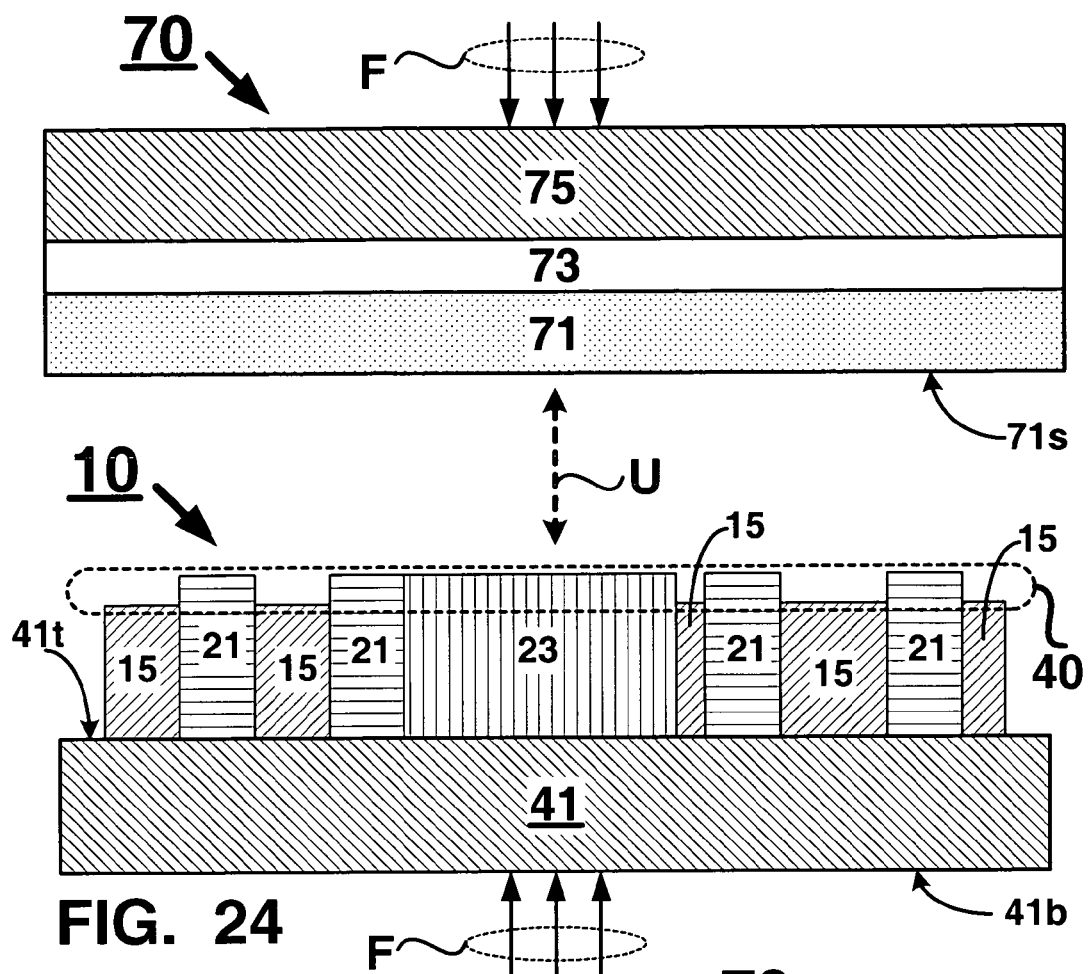
FIG. 24 is a cross-sectional view depicting an imprint stamp and a mask layer being urged into contact with each other.

In FIG. 24, after the selective etching, the imprint stamp 10 (as depicted in FIG. 22b) can optionally be connected with a master substrate 41, as was described above in reference to FIGS. 19g and 19h, in preparation for an imprinting process. As one example, an imprint media 70 that includes a substrate layer 75, a mask layer 71 with a surface 71s, and optionally, an under layer 73, is urged U into contact with the imprint stamp 10 by applying a force F to the imprint stamp 10 and/or the imprint media 70. Preferably, the surface 71s is a substantially planar surface.

Figure 25:
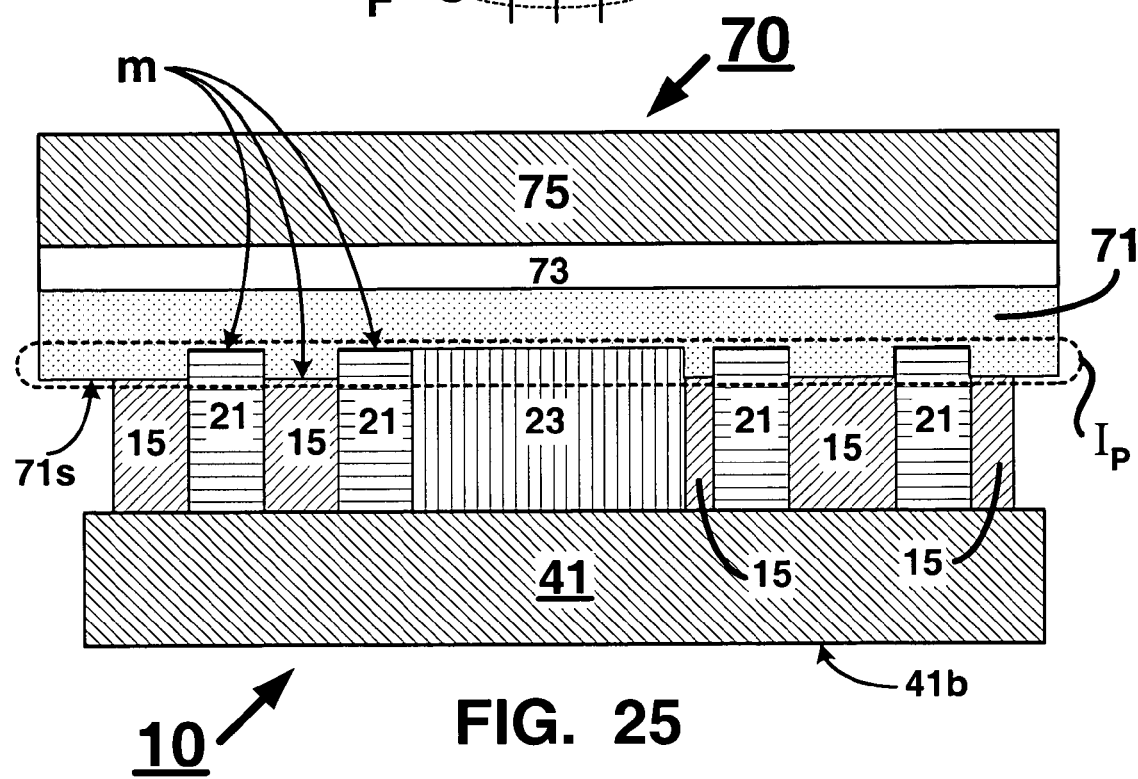
FIG. 25 is a cross-sectional view depicting the imprint stamp pressed into the mask layer of FIG. 24.

In FIG. 25, after the application specific imprint pattern 40 has been pressed into the mask layer 71, the mask layer 71 is modulated m with respect to the features 21, 23, and 15 of the imprint stamp 10 so that the mask layer 71 includes an imprinted pattern $I_p$ that complements the application specific imprint pattern 40. The substrates (41, 75) can be made from materials including but not limited to the same materials described above for the substrate 11 or the handling substrate 9.

Suitable materials for the mask layer 71 include but are not limited to a polymer, a photoresist material, and a silicone based elastomer material. For example, Polydimethyl Siloxane (PDMS), a silicone rubber, is widely recognized as a good material for soft lithography because of its flexibility, non-stick properties, and transparency to ultraviolet light. Accordingly, PDMS can be used for the mask layer 71. Suitable materials for the under layer 73 include but are not limited to a metal, a metal alloy, a glass, a heat and chemical resistant glass such as a borosilicate glass (e.g. a PYREX® borosilicate glass), a silicon oxide ($SiO_2$), a silicon nitride ($Si_3N_4$), a silicon carbide (SiC), an aluminum oxide ($Al_2O_3$), an indium phosphide (InP), and a semiconductor material.

Figure 26:
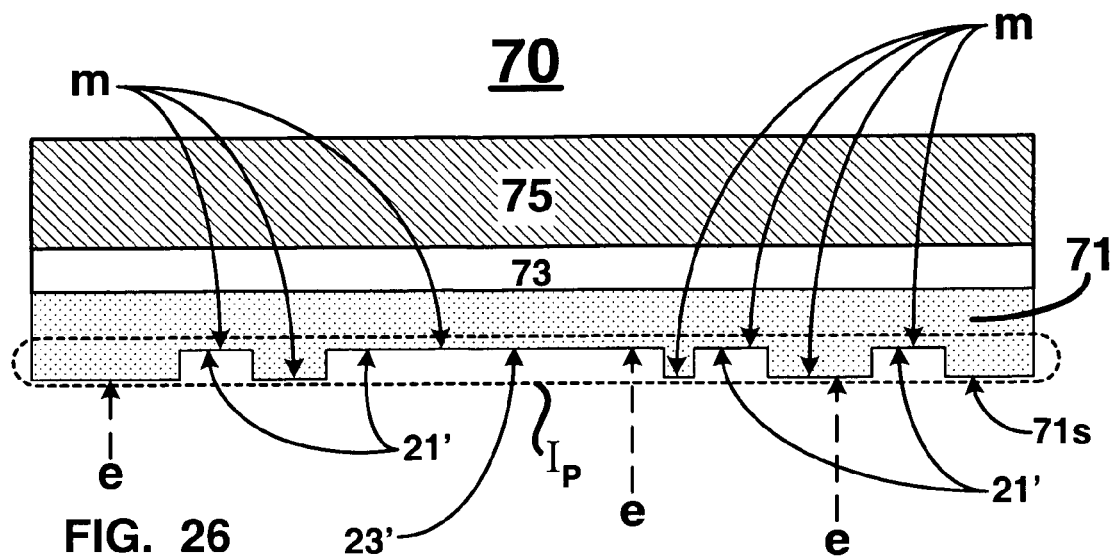
FIGS. 26 through 28 are cross-sectional views depicting an etching of a mask layer.

In FIG. 26, after the pressing, the imprint stamp 10 is withdrawn from the imprint media 70 and the imprint media 70 can be used in an imprint lithography process to imprint a target media (not shown) with the imprinted pattern $I_p$. On the other hand, the imprint media 70 can be used as mold upon which a target media is deposited or poured to transfer the imprinted pattern $I_p$ to the target media. For example, a metal or other electrically conductive material can be deposited on the imprinted pattern $I_p$ to form the contact pads 21 and the wires 23 (as depicted in FIGS. 20b and 20c). After the target media has cured or otherwise obtained a mechanically stable state, the target media can be released or peeled off of the imprinted pattern $I_p$. A layer of a release agent can be applied to the imprinted pattern $I_p$ to facilitate the release of the target media from the imprinted pattern $I_p$. For example, a material including but not limited to a Teflon® can be used as the release agent.

Figure 27:
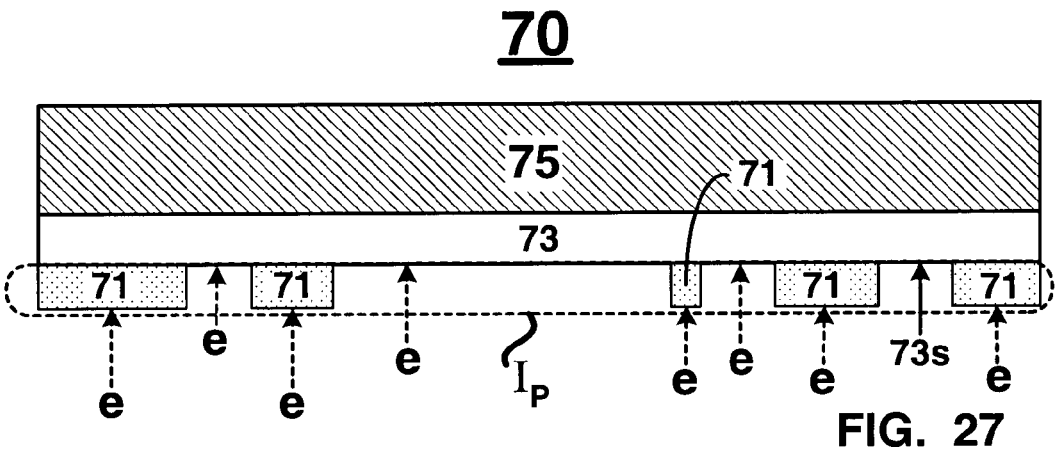
Figure 28:
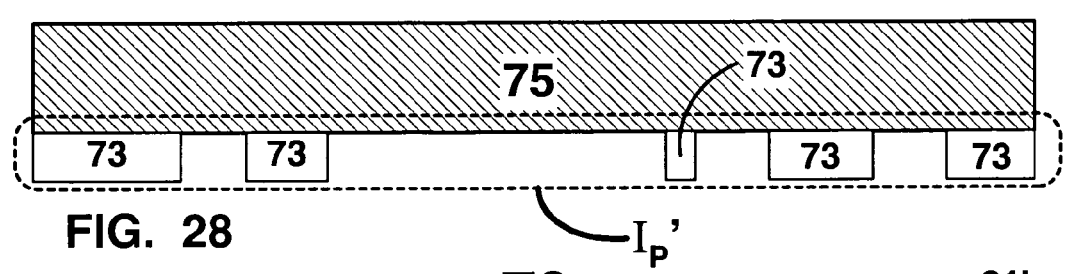

Alternatively, in FIG. 26, after the pressing, the mask layer 71 can be etched e to further resolve or modify the features in the imprinted pattern $I_p$. Optionally, in FIG. 27, the mask layer 71 can be etched e all the way to a surface 73s of the under layer 73. The etchant can be selective to a material of the mask layer 71 so that the under layer 73 serves as an etch stop layer. Additionally, in FIG. 27, the under layer 73 can be etched e with an etchant that is selective to a material of the under layer 73 so that a remaining portion of the mask layer 71 serves as an etch mask and the imprinted pattern $I_p$ is transferred (i.e. replicated) in the under layer 73 by the etching e (see $I_p$' in FIG. 28). For example, an anisotropic etching process can be used for the etching e of the mask layer 71 and/or the under layer 73.

Figure 29:
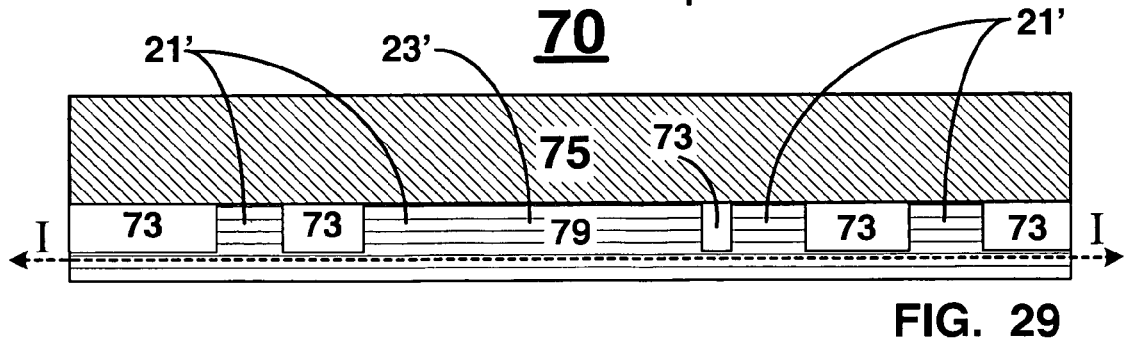
FIG. 29 is a cross-sectional view depicting a depositing of a target media on an imprinted pattern formed in a mask layer.

In FIG. 29, the imprint media 70 can be pressed into a target media 79 or the target media 79 can be deposited or poured onto the imprinted pattern $I_p$' so that the imprinted pattern $I_p$' is transferred to the target media 79. Optionally, the target media 79 can be planarized along a line I—I to form a substantially planar surface. If the target media 79 is an electrically conductive material, then the imprinted pattern $I_p$' that is replicated in the target media 79 can include the wires (denoted as 23') and the contact pads (denoted as 21') as was described above in reference to FIGS. 22a and 22b.

Figure 30A:
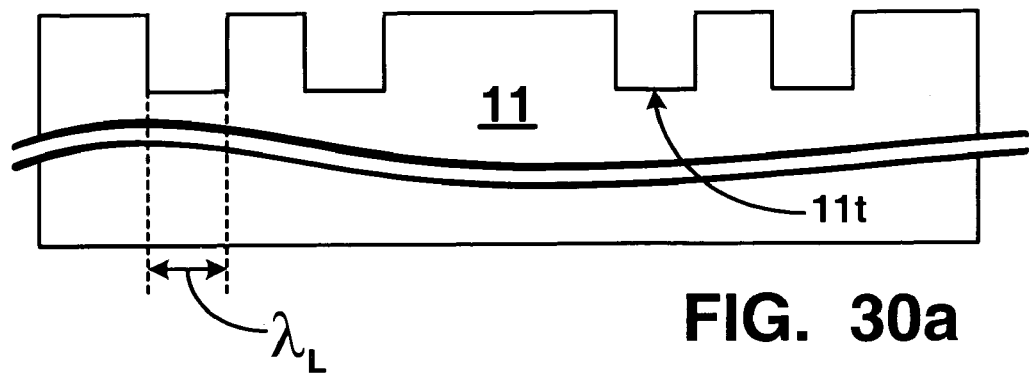
FIG. 30a is a cross-sectional view depicting a patterned substrate.
Figure 30B:
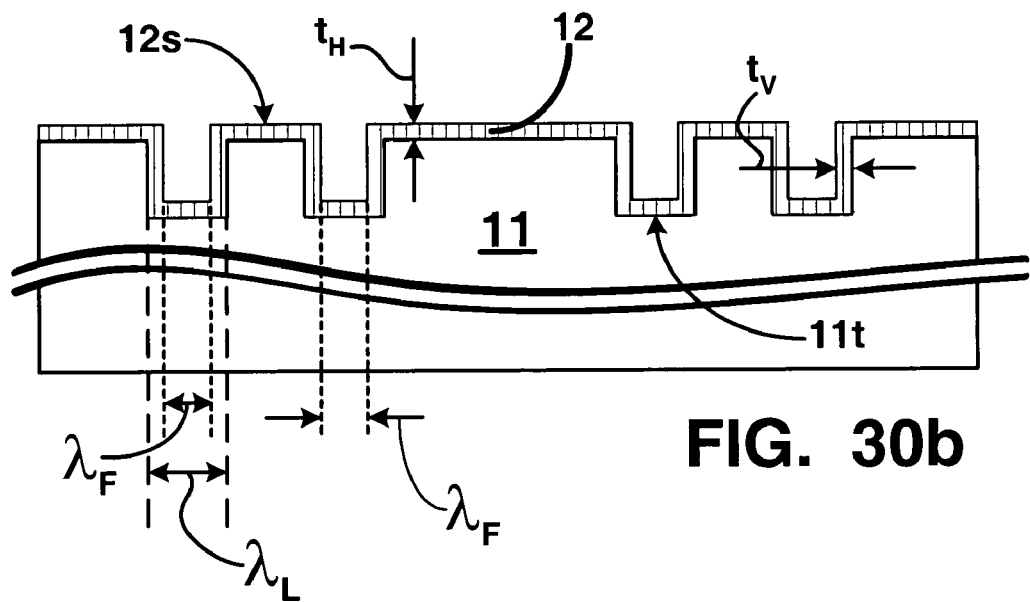
Figure 30C:
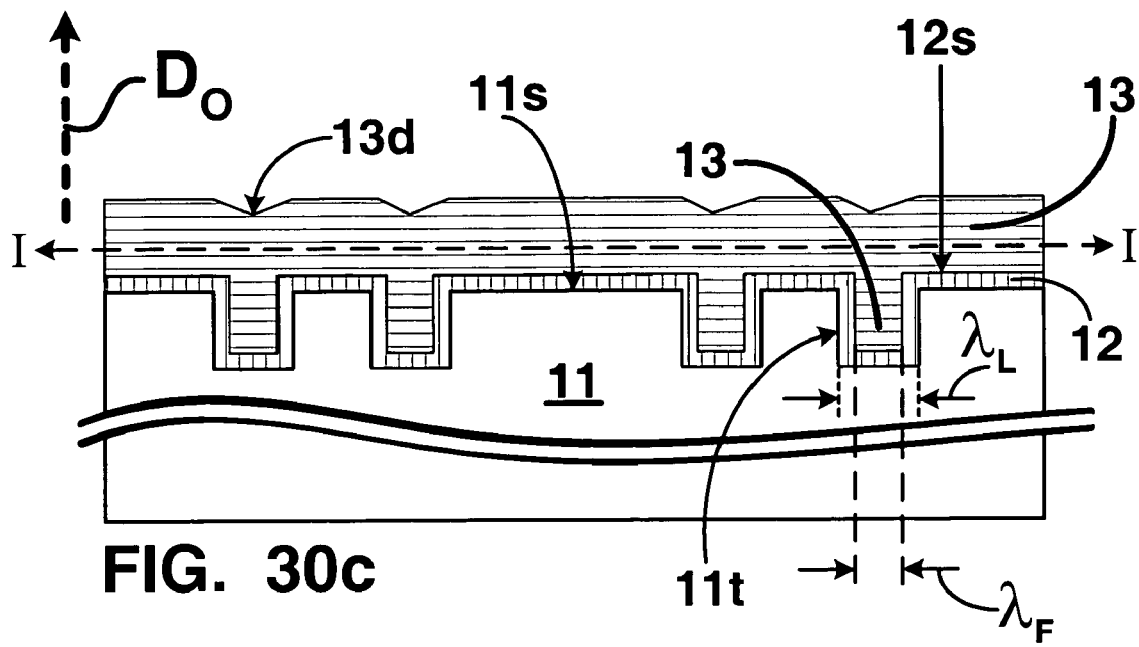
FIG. 30c is a cross-sectional view depicting a depositing of a first layer of material on a conformal layer of material.

Optionally, in FIGS. 30a and 30b and referring to the first embodiment of the method depicted in FIG. 8a, after the etching e of the substrate 11 at the stage 81 and prior to depositing the first layer of material 13 (see FIGS. 10, 11, and 12a) at the stage 82, at a stage 81' a conformal layer of material 12 is deposited on the substrate 11 and conformally fills in the trenches 11t so that a horizontal thickness $t_H$ of the conformal layer of material 12 along a horizontal surface of the substrate 11 is substantially equal to a vertical thickness $t_V$ of the conformal layer of material 12 along a vertical surface of the substrate 11 (i.e. along sidewall surfaces of the trenches 11t).

One advantage to depositing the conformal layer of material 12 is that it partially fills in a feature of the substrate 11, such as the trenches 11t, for example. As a result, the minimum resolution $\lambda_L$ of the trenches 11t can be reduced from $\lambda_L$ to a minimum feature size $\lambda_F$ that is less than $\lambda_L$ (i.e. $\lambda_F < \lambda_L$). Accordingly, in FIG. 30c, if the minimum resolution $\lambda_L$ is 100 nm, then after the depositing of the conformal layer of material 12 at the stage 81', followed by the depositing of the first layer of material 13 at the stage 82, then the minimum feature size $\lambda_F$ will be less than 100 nm.

Consequently, the depositing of the conformal layer of material 12 can be used to reduce the minimum feature size $\lambda_F$ to below to lithography limit (i.e. $\lambda_L$). As an example, if the vertical thickness $t_V$ is 10.0 nm and the minimum resolution $\lambda_L$ is 100 nm, then the conformal layer of material 12 can be used to make contact pads 21 (see FIGS. 22a and 22b) that have a minimum feature size $\lambda_F$ of 80 nm (i.e. 100 nm−[2*10 nm]=80 nm) that is less than the minimum resolution $\lambda_L$ of 100 nm. More than one conformal layer of material 12 can be deposited to further decrease the minimum feature size $\lambda_F$.

Figure 31A:
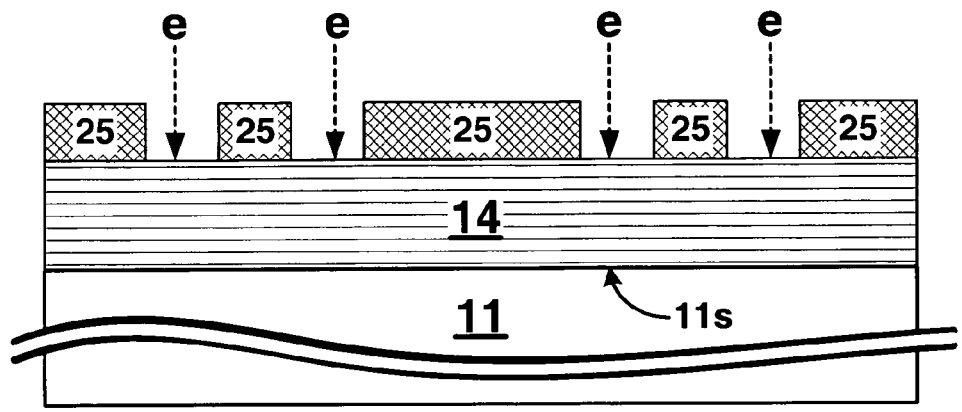
FIG. 31a is a cross-sectional view depicting a base layer of material deposited on a substrate.
Figure 31B:
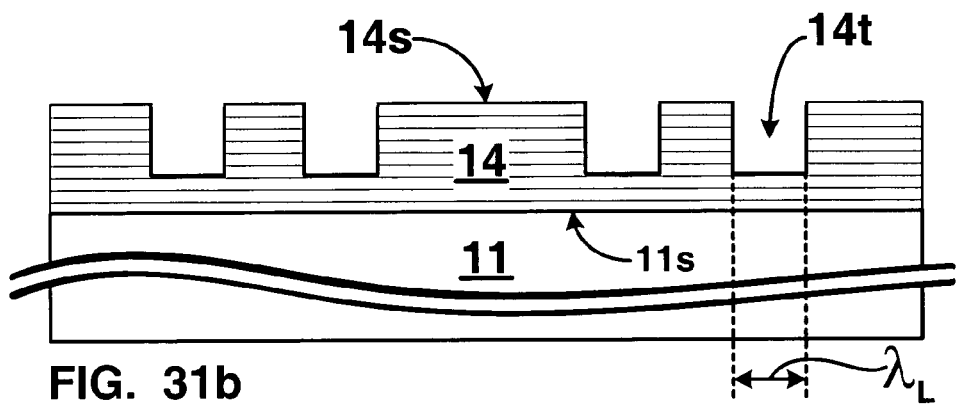
FIG. 31b is a cross-sectional view depicting a base layer of material after a patterning and an etching of the base layer of material.

In FIG. 31a, in the second embodiment of the method as depicted in FIG. 8b includes, at a stage 92, depositing a base layer of material 14 on a substrate 11. Preferably, the base layer of material 14 is deposited on a substantially planar surface 11s of the substrate 11. At a stage 93, the base layer of material 14 is patterned with an etch mask 25 as was described above in reference to FIG. 10. At a stage 94, the base layer of material 14 is etched e to form a pattern (see FIG. 31b) in the base layer of material 14. The pattern can include trenches 14t formed in the base layer of material 14 and extending inward of a surface 14s. The patterns formed will have a feature size that is greater than or equal to the minimum resolution $\lambda_L$.

Figure 31C:
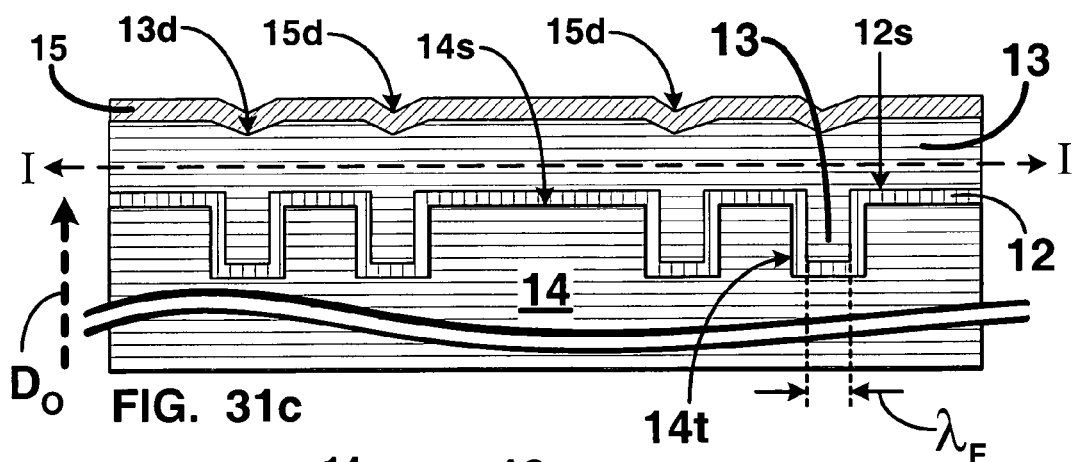
FIG. 31c is a cross-sectional view depicting a depositing of a conformal layer of material on a patterned base layer of material.
Figure 31D:
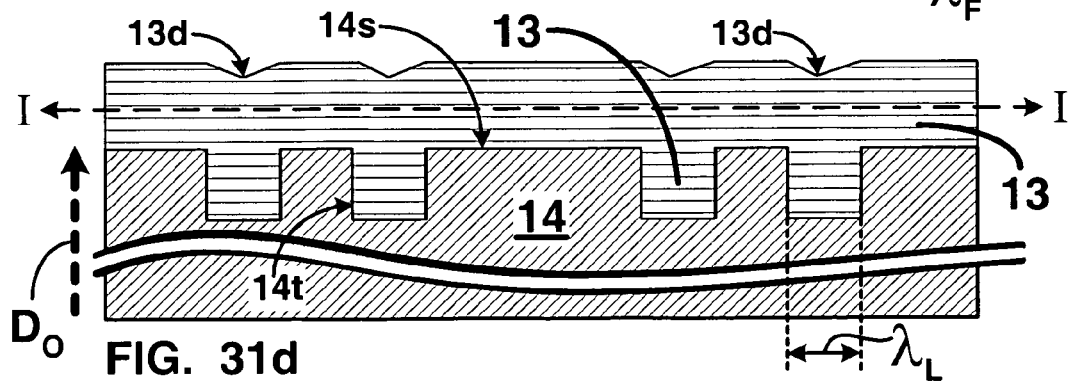
FIG. 31d is a cross-sectional view depicting a depositing of a first layer of material on a patterned base layer of material.

In FIG. 31d, at a stage 95, a first layer of material 13 can be deposited. The first layer of material is one of a plurality of layers of material that will be deposited in the deposition order $D_o$ and subsequently patterned and etched e as was described above in reference to FIGS. 12b through 19c. Optionally, at a stage 95', the first layer of material 13 can be planarized as was described above to form a substantially planar surface 13s along a line I—I.

Moreover, in FIG. 31c, at a stage 94', after the etching at the stage 94 and prior to the depositing of the first layer of material 13 at the stage 95, a conformal layer of material 12 is deposited on the base layer of material 14 and conformally fills in the trenches 14t so that a horizontal thickness $t_H$ of the conformal layer of material 12 along a horizontal surface of the base layer of material 14 is substantially equal to a vertical thickness $t_V$ of the conformal layer of material 12 along a vertical surface of the base layer of material 14 (i.e. along sidewall surfaces of the trenches 14t) as was described above in reference to FIGS. 30a through 30c.

In the second embodiment of the method as depicted in FIG. 8b, the stages 96 through 103 and optionally including a stage 101', are substantially identical to the stages 83 through 90 of FIG. 8a as described above in reference to FIGS. 12b through 23b. Consequently, after the application specific imprint pattern 40 is completely formed at a stage 101, followed by the segmenting at a stage 102 and the selectively etching at a stage 103, an imprint stamp 10 is formed as depicted in FIGS. 20a and 20b.

Etching processes that are well known in the microelectronics art can be used to etch the layers of material (12, 13, 15) and/or the substrates (11, 14). For example, an etch process including but not limited to a wet etch, a dry etch, a plasma etch, and a reactive ion etch (RIE), can be used. The etching process can include an anisotropic etch material or an isotropic etch material.

It may be desirable in some applications to not pattern and etch one or more of the layers of material (13, 15) after the depositing stages. Instead, the layer may be planarized so that the next layer in the deposition order $D_O$ is deposited on a substantially planar surface. For example, after one of the layers is planarized, the next layer in the deposition order $D_O$ may also not be patterned or etched so that it is also a substantially planar layer. As a result the planar layers can be used to impart a space between subsequent layers in the deposition order $D_O$ that will be patterned and etched to form variations in the topography of those subsequent layers.

Suitable materials for the layers of material (12, 13, 15) include but are not limited to those set forth in TABLE 1 below.

TABLE 1

Materials for the layers of material (12, 13, 15)

Silicon Oxide (SiO$_2$)
Silicon Nitride (Si$_3$N$_4$)
Polysilicon (α-Si) including A Doped Polysilicon
A Metal
A Metal Alloy
Silicon Oxynitride (Si$_2$N$_2$O)
Silicon Carbide (SiC)
Diamond like Carbon (C)
A Silicide
Tetraethylorthosilicate (TEOS)
A Boron (B) doped Tetraethylorthosilicate (BSG)
A Phosphorus (P) doped Tetraethylorthosilicate (PSG)
A Boron (B) and Phosphorus (P) doped Tetraethylorthosilicate (BPSG)
A Polymer
A Photoresist Material
A Dielectric Material
An Electrically Conductive Material It may be desirable in some applications to not pattern and etch one or more of the layers of material (13, 15) after the depositing stages. Instead, the layer may be planarized so that the next layer in the deposition order $D_O$ is deposited on a substantially planar surface. For example, after one of the layers is planarized, the next layer in the deposition order $D_O$ may also not be patterned or etched so that it is also a substantially planar layer. As a result the planar layers can be used to impart a space between subsequent layers in the deposition order $D_O$ that will be patterned and etched to form variations in the topography of those subsequent layers.

Deposition processes that are well understood in the microelectronics art can used to deposit the layers of material (13, 15). For example, a process including but not limited to chemical vapor deposition (CVD), plasma enhanced chemical vapor deposition (PECVD), sputtering, and atomic layer deposition (ALD) can be used to deposit the layers of material (13, 15).

A computer aided design (CAD) program can be used to create the application specific imprint pattern 40. For example, a layout tool used in the fabrication of microelectronic circuits, such as microprocessors, can be used to design a layout for the various layers of material (12, 13, 15). After the layout is complete, a plurality of photomasks can be generated using data from the layout tool and those photomasks can be used to pattern the layers of material by exposing a photoresist material deposited on the layer. The photoresist can then be developed to render the pattern in an etch mask 25, followed by etching the layer to form a portion of the application specific imprint pattern 40. The application specific imprint pattern 40 formed on the imprint stamp 10 can comprise any pattern and is not to be construed as being limited to the wires 23 and contact pads 21 as described herein for purposes of illustration only. Accordingly, each application will determine the actual shape and complexity of the patterns and features of the application specific imprint pattern 40.

Although several embodiments of the present invention have been disclosed and illustrated, the invention is not limited to the specific forms or arrangements of parts so described and illustrated. The invention is only limited by the claims.

What is claimed is:

1. A method of fabricating an imprint stamp, comprising:
patterning a substrate;
etching the substrate to form a pattern in the substrate;
depositing a first layer of material on the substrate;
patterning the first layer of material;
etching the first layer of material to form a portion of an application specific imprint pattern in the first layer of material, the portion including a variation in a topography of the first layer of material;
depositing an additional layer of material on a previously etched layer of material;
patterning the additional layer of material;
etching the additional layer of material to form an additional portion of the application specific imprint pattern in the additional layer of material, the additional portion including a variation in a topography of the additional layer of material;
repeating the depositing, the patterning, and the etching of additional layers of material until the application specific imprint pattern is completely defined and comprises a plurality of features that are defined by the variations in the topographies of all of the layers of material that were deposited, patterned, and etched;
segmenting the substrate to form an imprint blank that includes the application specific imprint pattern on an exposed cross-sectional surface thereof; and
selectively etching the exposed cross-sectional surface of the imprint blank to form the imprint stamp.

2. The method as set fourth in claim 1, wherein the segmenting of the substrate comprises partitioning the substrate into a plurality of individual segments along a direction that is substantially perpendicular to a surface of the substrate.

3. The method as set fourth in claim 1, wherein the selectively etching comprises an anisotropic etch.

4. The method as set fourth in claim 1, wherein the selectively etching comprises applying an etching material that selectively etches only some of the layers of material in the application specific imprint pattern, so that after the etching is completed, those layers of material that were not selectively etched stand proud of those layers that were selectively etched.

5. The method as set fourth in claim 4, wherein the selectively etching comprises an anisotropic etch.

6. The method as set fourth in claim 1, wherein the layers of material are made from a material selected from the group consisting of silicon oxide, silicon nitride, polysilicon, a metal, a metal alloy, silicon oxynitride, silicon carbide, diamond like carbon, a silicide, a tetraethylorthosilicate, a boron doped tetraethylorthosilicate, a phosphorous doped tetraethylorthosilicate, and a boron doped, a phosphorous doped tetraethylorthosilicate, a polymer, a photoresist, a dielectric material, and an electrically conductive material.

7. The method as set fourth in claim 1, wherein the substrate is made from a material selected from the group consisting of a glass, a borosilicate glass, silicon oxide, silicon nitride, aluminum oxide, and indium phosphide.

8. The method as set fourth in claim 1, wherein the substrate is a semiconductor material.

9. The method as set fourth in claim 8, wherein the semiconductor material is a material selected from the group consisting of a wafer of a semiconductor material, silicon, and a silicon wafer.

10. The method as set fourth in claim 1, wherein the plurality of features in the imprint stamp include a minimum feature size that is less than about 10.0 nanometers.

11. The method as set fourth in claim 1, wherein the plurality of features in the imprint stamp define at least one contact pad and at least one wire connected with the contact pad.

12. The method as set fourth in claim 11, wherein the plurality of features in the imprint stamp include a minimum feature size that is less than about 10.0 nanometers.

13. The method as set fourth in claim 1 and further comprising:
planarizing a last of the additional layers of material to be deposited so that the last of the additional layers of material includes a substantially planar surface.

14. The method as set fourth in claim 1 and further comprising:
planarizing the first layer of material after the depositing of the first layer of material.

15. The method as set fourth in claim 1, wherein at least one imprint stamp is connected with a master substrate.

16. The method as set fourth in claim 1 and further comprising:
depositing a conformal layer of material on the substrate, the depositing occurring after the etching of the substrate.

17. A method of fabricating an imprint stamp, comprising:
depositing a base layer of material on a substrate;
patterning the base layer of material;
etching the base layer of material to form a pattern in the base layer of material;
depositing a first layer of material on the base layer of material;
patterning the first layer of material;
etching the first layer of material to form a portion of an application specific imprint pattern in the first layer of material, the portion including a variation in a topography of the first layer of material;
depositing an additional layer of material on a previously etched layer of material;
patterning the additional layer of material;
etching the additional layer of material to form an additional portion of the application specific imprint pattern in the additional layer of material, the additional portion including a variation in a topography of the additional layer of material;
repeating the depositing, the patterning, and the etching of additional layers of material until the application specific imprint pattern is completely defined and comprises a plurality of features that are defined by the variations in the topographies of all of the layers of material that were deposited, patterned, and etched;
segmenting the substrate to form an imprint blank that includes the application specific imprint pattern on an exposed cross-sectional surface thereof; and
selectively etching the exposed cross-sectional surface of the imprint blank to form the imprint stamp.

18. The method as set fourth in claim 17 and further comprising:
planarizing the first layer of material after the depositing of the first layer of material.

19. The method as set fourth in claim 17, wherein at least one imprint stamp is connected with a master substrate.

20. The method as set fourth in claim 17 and further comprising:
depositing a conformal layer of material on the substrate, the depositing occurring after the etching of the base layer of material.

21. The method as set fourth in claim 17 and further comprising:
planarizing a last of the additional layers of material to be deposited so that the last of the additional layers of material includes a substantially planar surface.

22. The method as set fourth in claim 17, wherein the segmenting of the substrate comprises partitioning the substrate into a plurality of individual segments along a direction that is substantially perpendicular to a surface of the substrate.

23. The method as set fourth in claim 17, wherein the selectively etching comprises an anisotropic etch.

24. The method as set fourth in claim 17, wherein the selectively etching comprises applying an etching material that selectively etches only some of the layers of material in the application specific imprint pattern, so that after the etching is completed, those layers of material that were not selectively etched stand proud of those layers that were selectively etched.

25. The method as set fourth in claim 24, wherein the selectively etching comprises an anisotropic etch.

26. The method as set fourth in claim 17, wherein the layers of material are made from a material selected from the group consisting of silicon oxide, silicon nitride, polysilicon, a metal, a metal alloy, silicon oxynitride, silicon carbide, diamond like carbon, a silicide, a tetraethylorthosilicate, a boron doped tetraethylorthosilicate, a phosphorous doped tetraethylorthosilicate, and a boron doped, a phosphorous doped tetraethylorthosilicate, a polymer, a photoresist, a dielectric material, and an electrically conductive material.

27. The method as set fourth in claim 17, wherein the substrate is made from a material selected from the group consisting of a glass, a borosilicate glass, silicon oxide, silicon nitride, aluminum oxide, and indium phosphide.

28. The method as set fourth in claim 17, wherein the substrate is a semiconductor material.

29. The method as set fourth in claim 28, wherein the semiconductor material is a material selected from the group consisting of a wafer of a semiconductor material, silicon, and a silicon wafer.

30. The method as set fourth in claim 17, wherein the plurality of features in the imprint stamp include a minimum feature size that is less than about 10.0 nanometers.

31. The method as set fourth in claim 17, wherein the plurality of features in the imprint stamp define at least one contact pad and at least one wire connected with the contact pad.

32. The method as set fourth in claim 31, wherein the plurality of features in the imprint stamp include a minimum feature size that is less than about 10.0 nanometers.

* * * * *

UNITED STATES PATENT AND TRADEMARK OFFICE
CERTIFICATE OF CORRECTION

PATENT NO. : 7,060,625 B2
APPLICATION NO. : 10/766710
DATED : June 13, 2006
INVENTOR(S) : Heon Lee It is certified that error appears in the above-identified patent and that said Letters Patent is hereby corrected as shown below:

In column 13, line 62, after "11*t*" delete "it".

Signed and Sealed this

Twenty-second Day of December, 2009

David J. Kappos
*Director of the United States Patent and Trademark Office*